United States Patent
Sendai et al.

(10) Patent No.: US 7,166,204 B2
(45) Date of Patent: Jan. 23, 2007

(54) PLATING APPARATUS AND METHOD

(75) Inventors: Satoshi Sendai, Tokyo (JP); Kenya Tomioka, Tokyo (JP); Katsumi Tsuda, Tokyo (JP); Masayuki Kumekawa, Tokyo (JP); Koji Mishima, Tokyo (JP)

(73) Assignee: Ebara Corporation, Tokyo (JP)

( * ) Notice: Subject to any disclaimer, the term of this patent is extended or adjusted under 35 U.S.C. 154(b) by 509 days.

(21) Appl. No.: 10/204,274

(22) PCT Filed: Jan. 23, 2002

(86) PCT No.: PCT/JP02/00452

§ 371 (c)(1),
(2), (4) Date: Oct. 23, 2002

(87) PCT Pub. No.: WO02/059398

PCT Pub. Date: Aug. 1, 2002

(65) Prior Publication Data
US 2003/0057098 A1   Mar. 27, 2003

(30) Foreign Application Priority Data

Jan. 24, 2001  (JP) .......................... 2001-16018

(51) Int. Cl.
C25D 17/16 (2006.01)
C25D 5/00 (2006.01)
C25D 7/12 (2006.01)
C25D 17/00 (2006.01)

(52) U.S. Cl. ...................... 205/143; 205/157; 205/137; 204/199; 204/212; 204/214

(58) Field of Classification Search ................ 205/291, 205/137, 148, 157, 143; 204/199, 212, 267, 204/214

See application file for complete search history.

(56) References Cited

U.S. PATENT DOCUMENTS

| | | | | |
|---|---|---|---|---|
| 4,769,117 A | * | 9/1988 | Shiono et al. | 204/214 |
| 5,441,629 A | * | 8/1995 | Kosaki | 205/148 |
| 6,309,520 B1 | * | 10/2001 | Woodruff et al. | 204/242 |
| 6,391,166 B1 | * | 5/2002 | Wang | 204/224 R |
| 6,582,578 B1 | * | 6/2003 | Dordi et al. | 205/80 |
| 6,582,580 B1 | * | 6/2003 | Hongo et al. | 205/118 |
| 6,660,139 B1 | * | 12/2003 | Sendai et al. | 204/297.01 |

FOREIGN PATENT DOCUMENTS

| | | |
|---|---|---|
| WO | 99 41434 | 8/1999 |
| WO | 00 32835 | 6/2000 |
| WO | 02 058114 | 7/2002 |

* cited by examiner

Primary Examiner—Nam Nguyen
Assistant Examiner—Luan V. Van
(74) Attorney, Agent, or Firm—Wenderoth, Lind & Ponack, L.L.P.

(57) ABSTRACT

A plating apparatus and method which smoothly perform contact of a plating liquid with a surface of the substrate and which can prevent air bubbles from remaining on the surface to be plated. The plating apparatus includes a plating bath containing a plating liquid in which an anode is immersed, a head portion for holding a substrate detachably and bringing a lower surface, to be plated, of the substrate into contact with an overflow surface of the plating liquid held in the plating bath, a drive mechanism for rotating the head portion, and a tilt mechanism for tilting the head portion so that the substrate held by the head portion is inclined relative to a horizontal plane.

5 Claims, 29 Drawing Sheets

F I G. 17
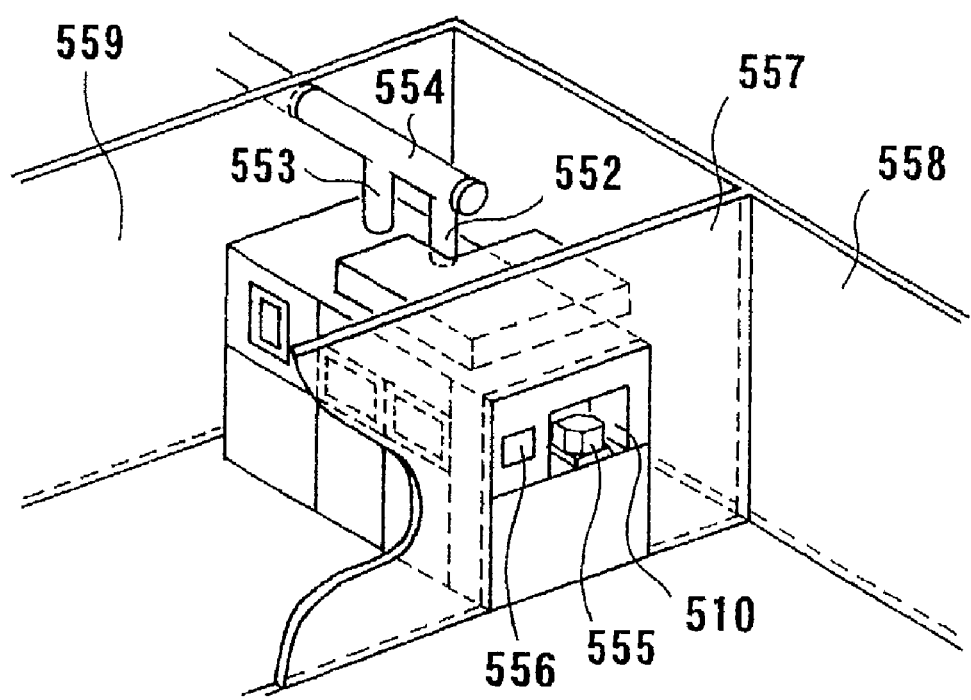

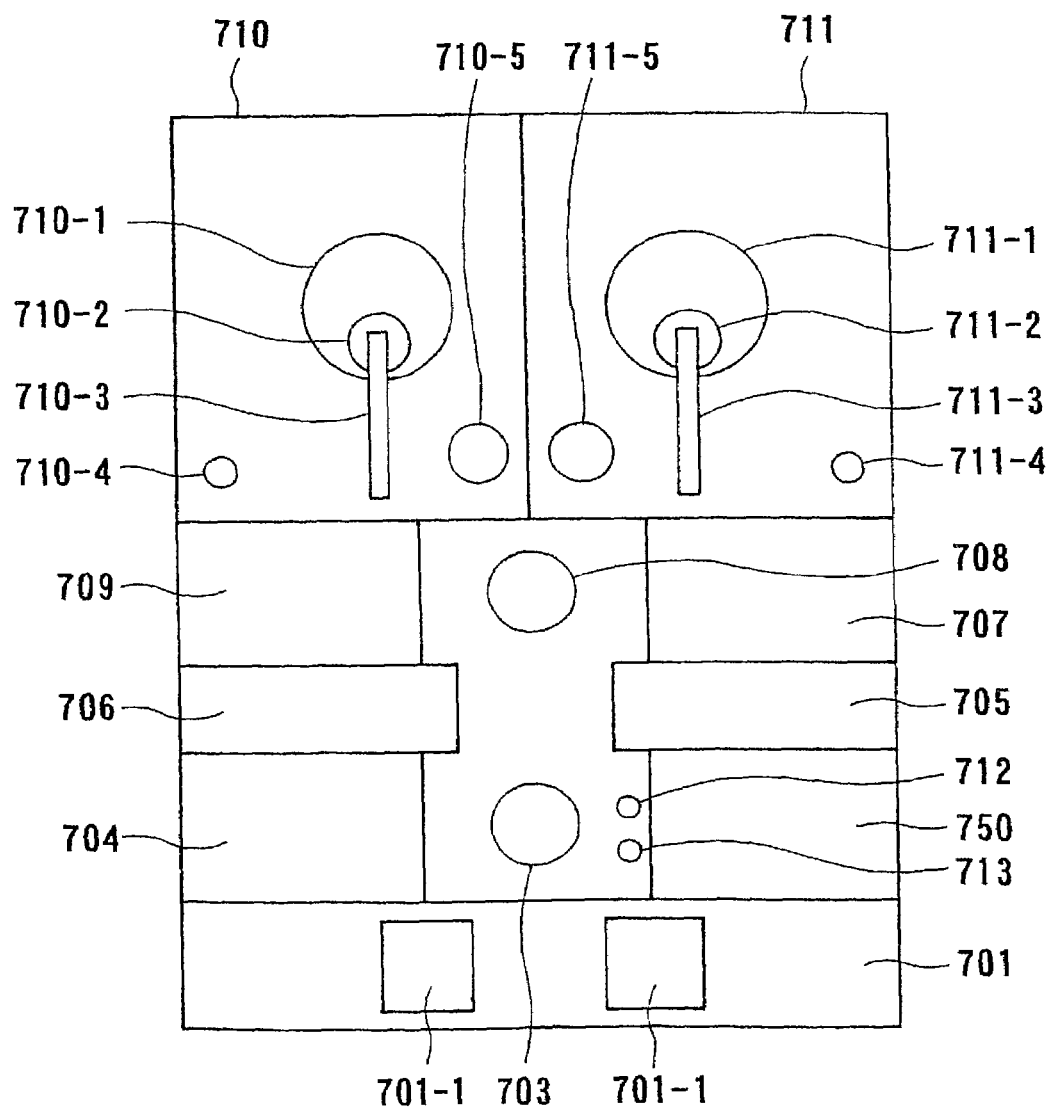
F I G. 22

F I G. 2 4
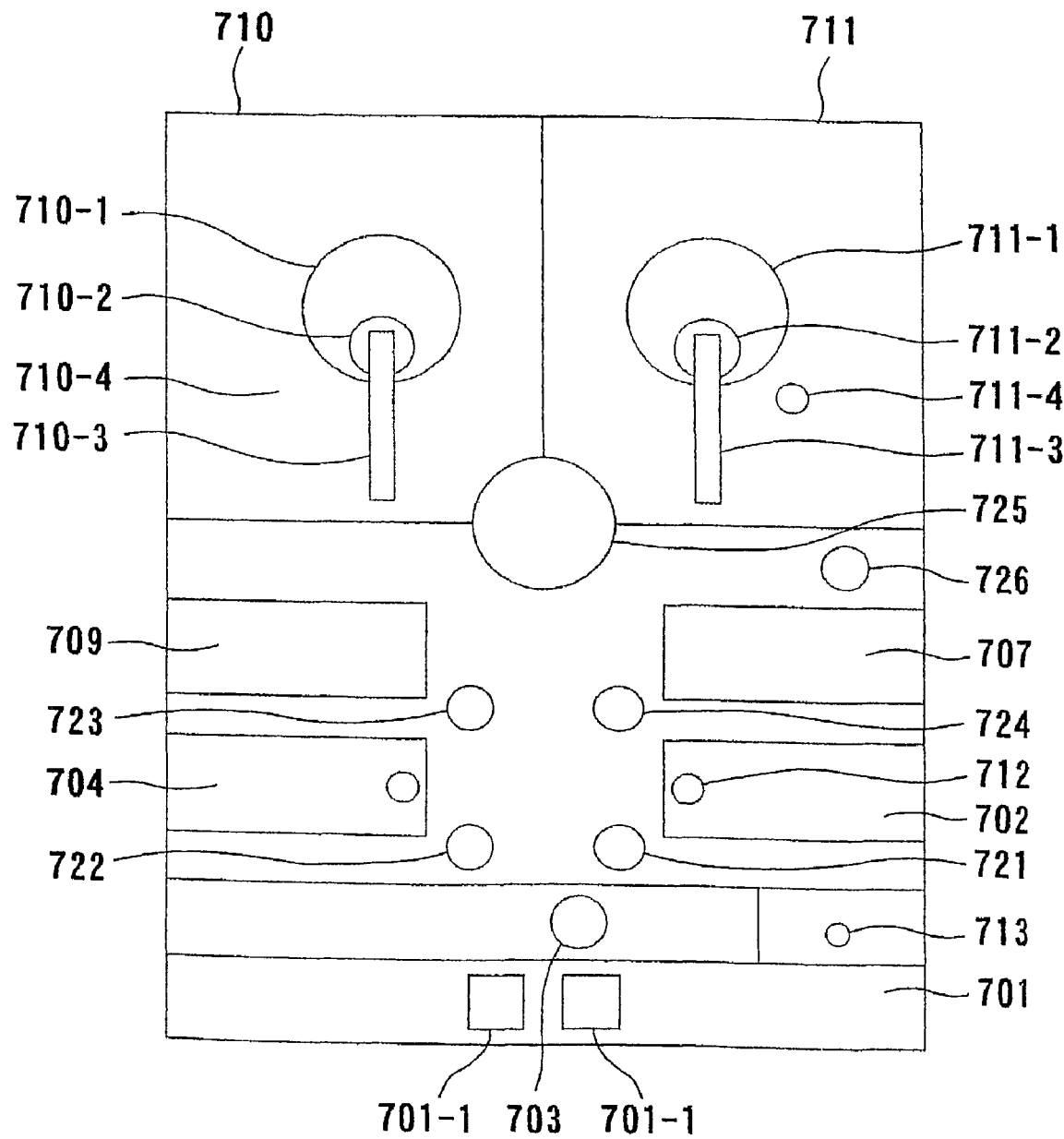

PLATING APPARATUS AND METHOD

BACKGROUND OF THE INVENTION

1. Technical Field of the Invention

This invention relates to a plating apparatus and a plating method. More particularly, the invention relates to a plating apparatus and a plating method used to fill fine recesses for interconnections formed on a surface of a semiconductor substrate with copper by plating, thereby forming copper interconnections.

2. Description of Related Art

Recently, it has become common practice to use apparatuses for metal plating, such as copper plating, in filling up fine trenches or via holes for interconnections formed on the surface of a substrate such as a semiconductor wafer. Using the apparatuses, the trenches or via holes are filled with plated metal, such as copper with lower electric resistivity than aluminum or aluminum-based materials, thereby forming buried interconnections or the like.

FIG. 13 shows a conventional general constitution of a jet plating apparatus adopting a facedown method among the plating apparatuses of the above-mentioned type. This plating apparatus comprises a cylindrical plating bath 112 opening upward and holding a plating liquid 10 therein, and a head portion 114 for detachably holding a substrate W, such as a semiconductor wafer, so as to face downward, and disposing the substrate W at a position at which it closes the upper opened end of the plating bath 112. A flat plate-shaped anode plate 116 immersed in the plating liquid 10 to serve as an anode is horizontally placed inside the plating bath 112, and the surface (the surface to be plated) of the substrate W is designed to serve as a cathode. The anode plate 116 is made of a porous material or a mesh-like material.

A plating liquid ejection pipe 118 for forming an upward flow of a plating liquid is connected to the center of the bottom in the plating bath 112. A plating liquid reservoir 120 is placed outside an upper portion of the plating bath 112. The plating liquid ejection pipe 118 is connected to a plating liquid supply pipe 128 extending from a plating liquid storage tank 122 and having a pump 124 and a filter 126 installed in the interior thereof. The plating liquid storage tank 122 is connected to a plating liquid return pipe 130 extending from the plating liquid reservoir 120.

According to this structure, the substrate W is held in such a state that the surface of the substrate W face downwardly at the top of the plating bath 112 by the head portion 114. With a certain voltage being applied between the anode plate 116 (anode) and the surface of the substrate W (cathode), the plating liquid 10 inside the plating liquid storage tank 122 is ejected upwardly from the bottom of the plating bath 112 by the pump 124 to direct a flow of the plating liquid vertically at the lower surface (the surface to be plated) of the substrate W. In this manner, plating current is flowed between the anode plate 116 and the substrate W to form a plated film on the lower surface of the substrate W. At this time, the plating liquid 10, which has overflowed the plating bath 112, is recovered by the plating liquid reservoir 120, and returned to the plating liquid storage tank 122.

With the conventional jet plating apparatus, the substrate is lowered while being held horizontally, whereby the lower surface (the surface to be plated) of the substrate is brought into contact with the liquid surface (overflow surface) of the plating liquid. The substrate is further lowered, until the entire lower surface of the substrate is immersed in the plating liquid. Therefore, when the substrate is immersed in the plating liquid, air bubbles are liable to remain on the lower surface of the substrate. As a result, a normal plated film cannot be formed, and defects, such as a deficiency in the plated film, tend to be produced.

SUMMARY OF THE INVENTION

The present invention has been accomplished in light of the foregoing circumstances. Its object is to provide a plating apparatus and a plating method which smoothly perform contact of the plating liquid with the surface to be plated and which can prevent air bubbles from remaining on the surface to be plated.

According an aspect of the present invention, there is provided a plating apparatus, comprising: a plating apparatus, comprising: a plating bath containing a plating liquid; an anode immersed in the plating bath; a head portion for holding a substrate, and for placing a surface of the substrate in contact with an surface of the plating liquid; a drive mechanism for rotating the head portion; and a tilt mechanism for tilting the head portion so that the substrate held by the head portion is inclined relative to the horizontal plane.

According to this feature, the surface of the substrate may be brought into contact with the surface of the plating liquid by vertically moving the substrate relative to the surface of the plating liquid while rotating the substrate, with the head portion being tilted to incline the substrate relative to the horizontal surface. As a result, contact of the plating liquid with the surface to be plated can be smoothed, and air bubbles can be prevented from remaining on the surface to be plated.

The plating bath may be provided with jet means for bulging the surface of the plating liquid at the center portion of the surface. The jet means comprises, for example, a plating liquid ejection nozzle.

The plating liquid ejection nozzle is horizontally placed, generally, but may be inclined upwardly protruding toward the center of the plating bath.

The drive mechanism may have a motor for rotating the head portion, and the head portion may be connected to an output shaft of the motor. The motor may be moved vertically by the drive mechanism.

The tilt mechanism is adapted, for example, to tilt the drive mechanism, which supports the head portion, about a tilt fulcrum thereof. The tilt fulcrum of the tilt mechanism may be positioned substantially the same plane as a plane formed by the overflow surface of the plating liquid held in the plating bath. In this manner, the range in which the head portion tilts is maximally narrowed to achieve the small, compact size of the plating apparatus.

The tilt mechanism is adapted, for example, to incline the substrate held by the head portion ranging from 2° to 10° relative to the horizontal plane.

The tilt mechanism is, preferably, provided with a stopper for preventing the tilt mechanism from tilting in the reverse direction.

The plating bath is, preferably, adapted to cope with the magnitude of the amount of a plating liquid supplied during plating process.

The head portion has, preferably, an air vent hole therein, and is provided with a substrate centering mechanism for performing centering of the substrate.

According to another aspect of the present invention, there is provided a plating apparatus, comprising: a plating bath containing a plating liquid; an anode immersed in the plating bath; a head portion for holding a substrate, and for placing a surface of the substrate in contact with an surface of the plating liquid; and a drive mechanism for rotating and lowering the substrate held by the head portion; wherein the head portion is adapted to hold the substrate such that the substrate is inclined relative to the horizontal plane, and the anode is disposed parallel to the substrate held by the head portion.

According to this feature, the substrate and the surface of the plating liquid are relatively moved, with the substrate being held and rotated, whereby the lower surface (the surface to be plated) of the substrate can be brought into contact with the surface of the plating liquid, with the substrate being inclined relative to the horizontal plane. In this state, moreover, plating can be performed.

The head portion is adapted to hold the substrate such that the substrate is inclined, for example, ranging from 1° to 10° relative to the horizontal plane.

According to still another aspect of the present invention, there is provided a plating method, comprising: holding a plating liquid in a plating bath; holding a substrate such that the substrate being inclined relative to the horizontal plane; lowering the substrate relative to an surface of the plating liquid held in a plating bath while rotating the substrate to bring the surface of the substrate into contact with the surface of a plating liquid; and plating the substrate to fill copper into contact holes and trenches of the substrate.

The substrate may be held so as to be inclined ranging from 2° to 10° relative to the horizontal plane, and brought into the horizontal state after the surface of the substrate is immersed in the plating liquid.

The substrate is generally rotated at a rotational speed ranging from 10 to 250 rpm, preferably ranging from 40 to 200 rpm.

The substrate may be vertically moved at a speed ranging from 10 to 250 mm/sec relative to the overflow surface of the plating liquid held in said plating bath.

According to a further aspect of the present invention, there is provided a plating method, comprising: holding a plating liquid in a plating bath; holding a substrate such that the substrate being inclined relative to the horizontal plane; lowering the substrate relative to an surface of the plating liquid held in a plating bath while rotating the substrate to bring the surface of the substrate into contact with the surface of a plating liquid; and holding the substrate in the inclined state after an entire surface of the substrate is immersed in the plating liquid.

The substrate is held so as to be inclined, for example, ranging from 1° to 10° relative to the horizontal plane.

The above and other objects, features, and advantages of the present invention will be apparent from the following description when taken in conjunction with the accompanying drawings which illustrates preferred embodiments of the present invention by way of example.

BRIEF DESCRIPTION OF DRAWINGS

FIG. 17 is a perspective view of the substrate plating apparatus shown in FIG. 14, which is placed in a clean room;

FIG. 22 is a view showing another plan constitution example of the semiconductor substrate processing apparatus;

FIG. 24 is a view showing still another plan constitution example of the semiconductor substrate processing apparatus;

DETAILED DESCRIPTION OF THE INVENTION

Preferred embodiments of the present invention will now be described in detail with reference to the accompanying drawings.

Figure 1:
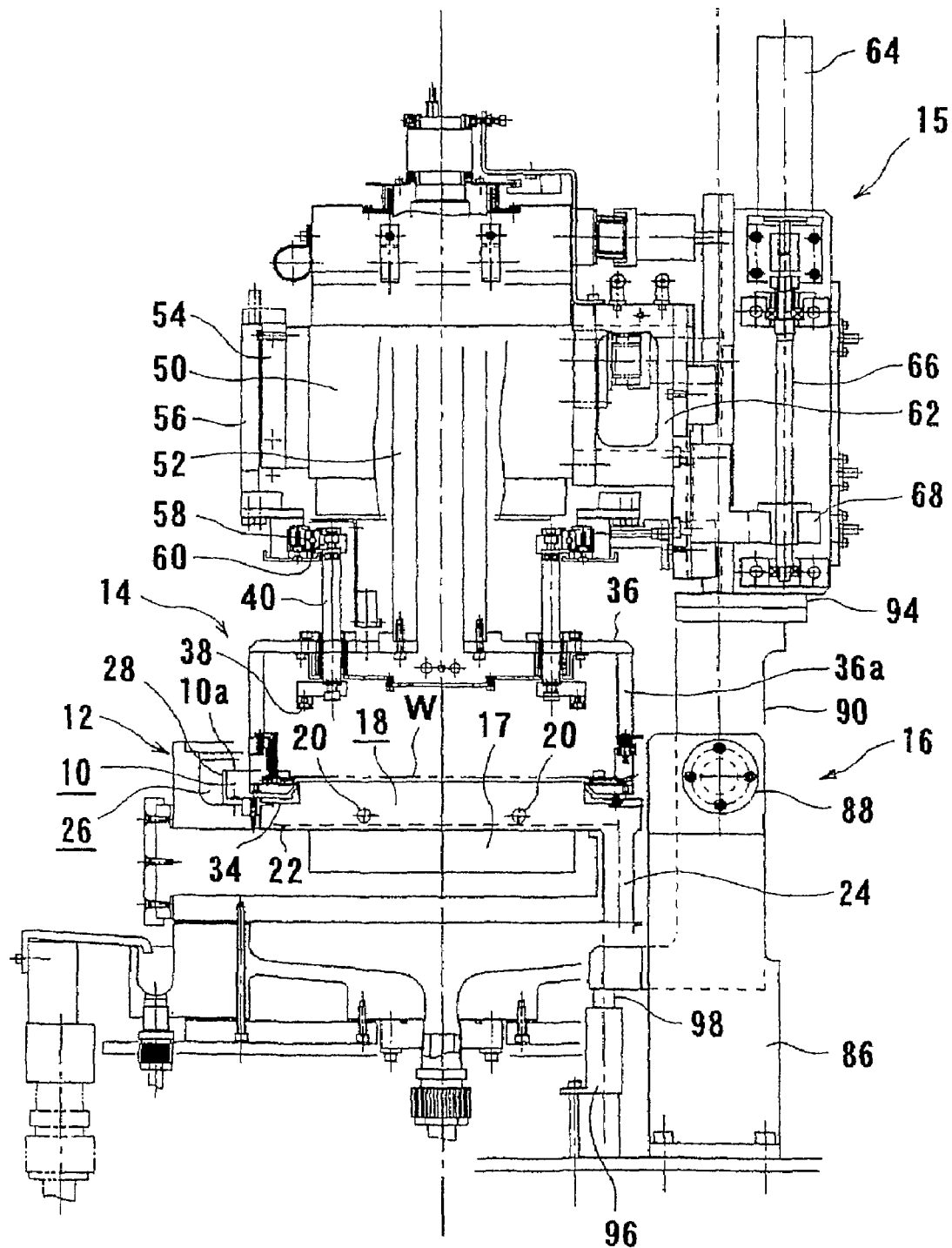
FIG. 1 is a front view showing a plating apparatus according to a first embodiment of the present invention being located at a plating position.
Figure 2:
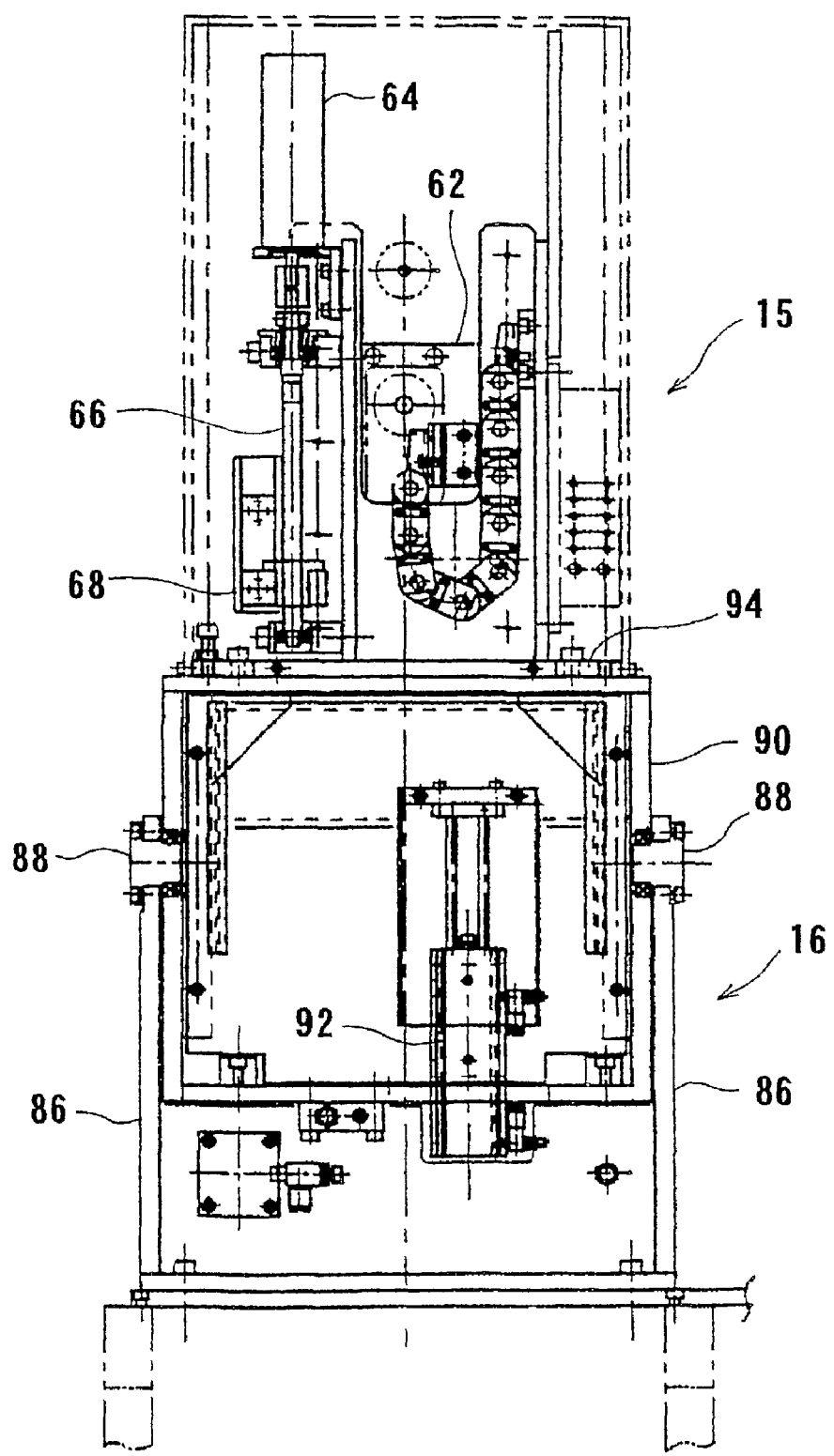
FIG. 2 is a left side view of the plating apparatus in FIG. 1.

FIGS. 1 to 9 show a plating apparatus according to a first embodiment of the present invention. The plating apparatus mainly comprises a substantially cylindrical plating bath 12 for containing a plating liquid 10 therein, a head portion 14 disposed above the plating bath 12 and adapted to hold a substrate W, a drive mechanism 15 for rotating and vertically moving the head portion 14, and a tilt mechanism 16 for tilting the head portion 14 and the drive mechanism 15 integrally. FIG. 1 shows the plating apparatus lying at a plating position at which the head portion 14 is lowered and an overflow surface (liquid level) 10a of the plating liquid 10 is raised.

The plating bath 12 has a plating chamber 18 opening upward and having a flat plate-shaped anode 17 disposed horizontally at the bottom thereof. On the inner peripheral wall of the plating bath 12, plating liquid ejection nozzles 20 horizontally protruding toward the center of the plating chamber 18 are arranged at equal intervals along the circumferential direction. These plating liquid ejection nozzles 20 communicate with a plating liquid supply passage (not shown) extending vertically within the plating bath 12. The plating liquid ejection nozzles 20 may be inclined upwardly protruding toward the center of the plating chamber 18.

In this embodiment, moreover, a punched plate 22 formed many holes, for example, of about 3 mm is disposed in the plating chamber 18 at a position above the anode 17 to thereby prevent a black film, which is formed on the surface of the anode 17, from being brought up by the flow of the plating liquid 10 and flowed out.

Figure 7C:
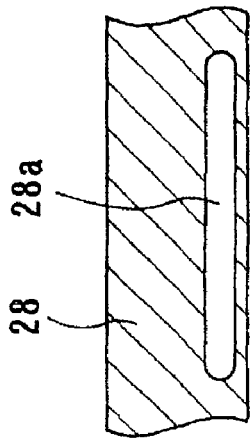
FIGS. 7A to 7D are views for illustrating the flow of a plating liquid during plating and in a non-plating situation.
Figure 7D:
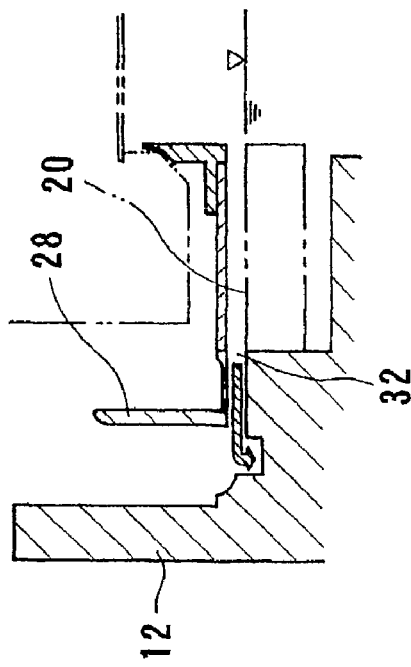

The plating bath 12 is also provided with a first plating liquid discharge port 24 for pulling out the plating liquid 10 in the plating chamber 18 from the peripheral edge of the bottom of the plating chamber 18, and a second plating liquid discharge port 30 (see FIGS. 7A and 7B) designed to discharge the plating liquid 10, which has overflowed an overflow weir 28 for dividing the interior of the plating bath 12 into the plating chamber 18 and an overflow channel 26, and to discharge the plating liquid 10 before overflowing the overflow weir 28. In a lower portion of the overflow weir 28, openings 28a with a predetermined width are provided at predetermined intervals along the circumferential direction in order to discharge the plating liquid 10 before overflowing the overflow weir 28 to the second plating liquid discharge port 30, as shown in FIGS. 7A to 7C.

Figure 7A:
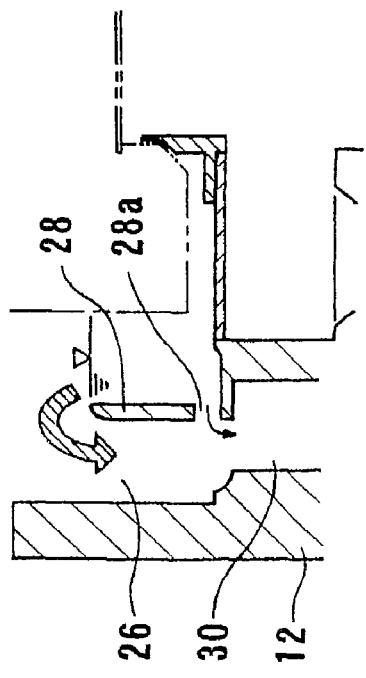
Figure 7B:
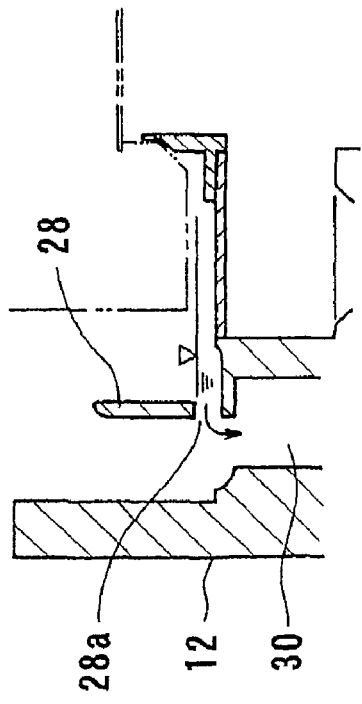

Because of this structure, when the amount of a plating liquid supplied is large during a plating process, the plating liquid is caused to overflow the overflow weir 28, and further passed through the openings 28a for discharging to the outside through the second plating liquid discharge port 30, as shown in FIG. 7A. When the amount of a plating liquid supplied is small during a plating process, the plating liquid is passed through the openings 28a and discharged to the outside through the second plating liquid discharge port 30, as shown in FIG. 7B. These contrivances permit easy adaptation to the magnitude of the amount of a plating liquid. The plating liquid present between a shielding plate and the overflow weir 28 when the liquid level of the plating liquid is lowered can be withdrawn through the openings 28a.

Furthermore, as shown in FIG. 7D, through-holes 32 for liquid level control, which communicate with the plating chamber 18 and the second plating liquid discharge port 30, are provided above the plating liquid ejection nozzles 20 and with a predetermined pitch along the circumferential direction. Thus, the plating liquid is passed through the through-holes 32 in a non-plating process to be discharged to the outside through the second plating liquid discharge port 30, whereby the liquid level of the plating liquid in the plating chamber 18 is controlled. These through-holes 32 play the role of orifices during the plating process to restrict the amount of the plating liquid flowing out therethrough.

Near the periphery of the interior of the plating chamber 18, a flow adjusting ring 34 of a hook-shaped cross section is disposed by having the outer peripheral end thereof secured to the plating bath 12. The flow adjusting ring 34 serves to push up the center of the plating liquid surface by an upper flow of the plating liquid 10 divided into upper and lower flows in the plating chamber 18, to smooth the lower flow, and make the distribution of an electric current density more uniform.

Figure 6:
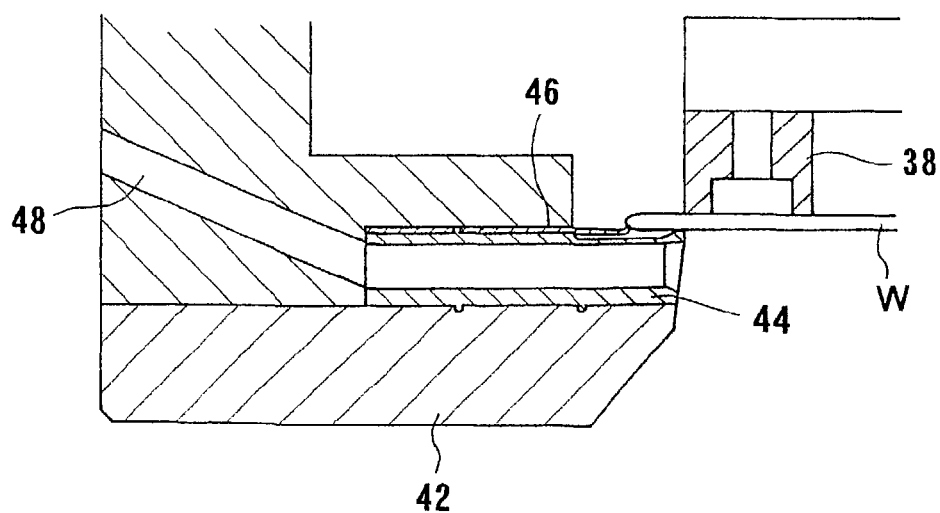
FIG. 6 is a partially enlarged view of FIG. 5.

The head portion 14 comprises a rotatable, bottomed, cylindrical housing 36 opening downward and having openings 36a in a circumferential wall thereof, and vertically movable press rods 40 attached to a press ring 38 at the lower end thereof. A ring-shaped substrate holding portion 42 protruding inwardly is provided at the lower opened end of the housing 36, as shown in FIG. 6. A ring-shaped seal member 44, which protrudes inwardly and has an upper surface projecting upward at the front end in the shape of a pinnacle, is attached to the substrate holding portion 42. Cathode electrode contacts 46 are disposed above the seal member 44. In the substrate holding portion 42, air vent holes 48, which extend outwardly in a horizontal direction and further extend upwardly obliquely toward the outside, are provided at equal intervals along the circumferential direction. The air vent holes 48 can inhibit air bubbles from remaining on the surface of the substrate. Decreasing the thickness of the seal member 44 and the substrate holding portion 42 can also ensure similar air venting properties. The air venting properties are also governed by the material for the substrate holding portion, and a smooth, water repellent material, such as Teflon, is preferably used as the substrate holding portion.

Figure 5:
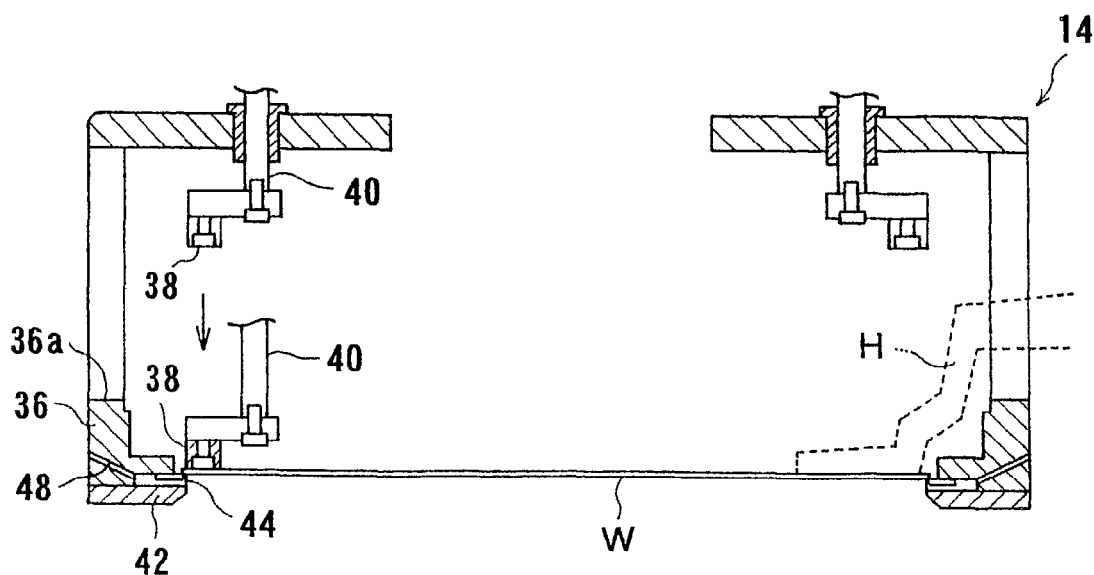
FIG. 5 is a sectional view for illustrating the relationship among a housing, a press ring, and a substrate during transfer of the substrate.

With the liquid level of the plating liquid 10 in the plating chamber 18 being lowered, the substrate W is held and put into the housing 36 by an attraction hand H or the like so as to place the substrate on the upper surface of the seal member 44 of the substrate holding portion 42. After the attraction hand H is pulled out of the housing 36, the press ring 38 is lowered to hold the substrate W while sandwiching a peripheral edge portion of the substrate W between the seal member 44 and the lower surfaces of the press ring 48, as shown in FIGS. 5 and 6. When the substrate W is held in this manner, the lower surface of the substrate W and the seal member 44 are brought into pressed contact to achieve reliable sealing there. At the same time, a seed layer 7 (see FIG. 10A) formed on the surface of the substrate W and the cathode electrode contacts 46 are brought into contact to pass an electric current therethrough, so that the seed layer 7 becomes a cathode.

A rotating motor 50 is provided in the drive mechanism 15. The housing 36 is connected to an output shaft 52 of the motor 50, and is adapted to rotate by driving of the motor 50. The press rods 40 are positioned vertically at predetermined positions along the circumferential direction of a ring-shaped support frame 60 rotatably supported via a bearing 58 at the lower end of a slider 56 movable vertically by the actuation of a guide-equipped cylinder 54 secured to the motor 50. Thus, the press rods 40 move vertically according to the actuation of the cylinder 54, and when the substrate W is held, are adapted to rotate integrally with the housing 36.

A connector 62 is mounted on the outer peripheral surface of the rotating motor 50. A slide base 68, which is screwed to a ball screw 66 rotating in accordance with the driving of an elevating motor 64 so as to move vertically together with, is attached to the connector 62. Thus, the rotating motor 50 and the head portion 14 are moved up and down integrally in accordance with the driving of the elevating motor 64.

Crystals of the plating liquid easily deposit on the inner peripheral surface of the overflow weir 28. If a large amount of the plating liquid is flowed, with the head portion 14 and the drive mechanism 15 being raised, to cause an overflow over the overflow weir 28, deposition of crystals of the plating liquid on the inner peripheral surface of the overflow weir 28 can be prevented.

Figure 8:
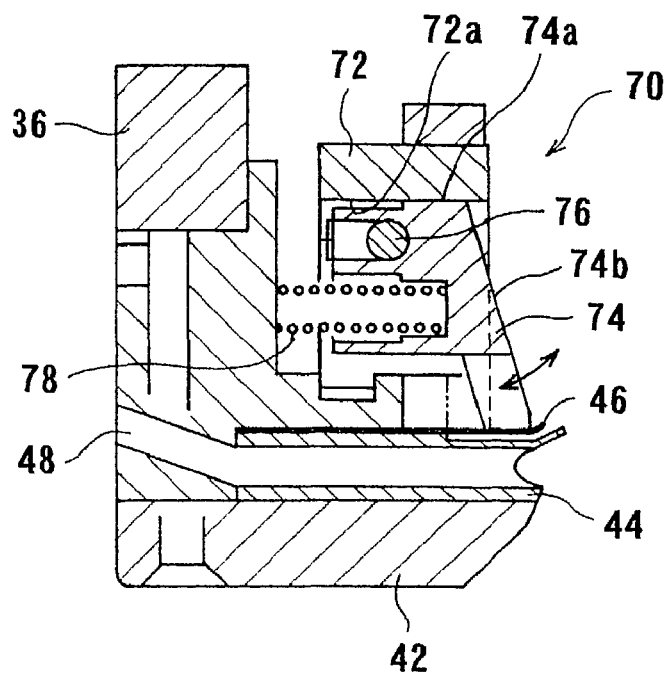
FIG. 8 is an enlarged sectional view of a centering mechanism.

Above the substrate holding portion 42 of the housing 36, a substrate centering mechanism 70 for performing centering of the substrate W is provided at each of four sites along the circumferential direction in this embodiment. FIG. 8 shows details of the substrate centering mechanism 70, which includes a gate-shaped bracket 72 fixed to the housing 36, and a positioning block 74 placed within the bracket 72. The positioning block 74 has an upper portion pivotably supported by a pivot shaft 76 horizontally fixed to the bracket 72, and a helical compression spring 78 is interposed between the housing 36 and the positioning block 74. Thus, the positioning block 74 is urged via the helical compression spring 78 such that its lower portion protrudes inwardly about the pivot shaft 76, while its upper surface 74a contacts a lower surface 72a of an upper portion of the bracket 72 to play the role of a stopper, whereby the movement of the positioning block 74 is restrained. Furthermore, the inner surface of the positioning block 74 makes a taper surface 74b fanning out upwardly.

When the substrate is held and transferred by an attraction hand, such as a transfer robot, into the housing 36 to be placed on the substrate holding portion 42, the center of the substrate may be displaced from the center of the substrate holding portion 42. In this case, the positioning block 74 pivots outward in opposition to the elastic force of the helical compression spring 78. On this occasion, when the grasp by the attraction hand such as carrier robot is released, the positioning block 74 returns to the original position under the elastic force of the helical compression spring 78, whereby centering of the substrate can take place.

Figure 9:
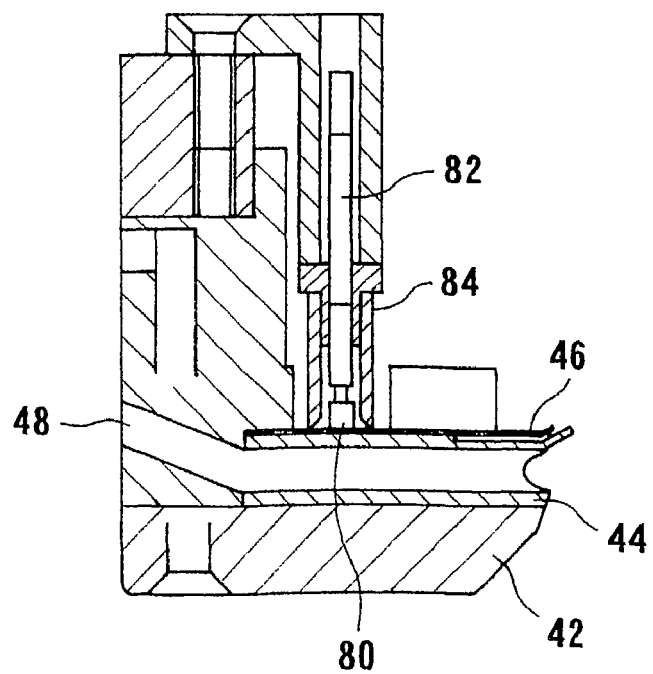
FIG. 9 is a sectional view showing a power supply contact (probe)

FIG. 9 shows a power supply contact (probe) 82 for supplying power to a cathode electrode plate 80 of the cathode electrode contact 46. The power supply contact 82 is composed of a plunger, and surrounded by a cylindrical protector 84 reaching to the cathode electrode plate 80, and thereby protected from the plating liquid.

The tilt mechanism 16 includes rests 86 erected with predetermined spacing on a floor surface, a tilt stand 90, which consists of two uprights connected by a third member at the bottom, connected to the rests 86 so as to be tiltable about pivot shafts 88 as fulcrums of rotation, and a tilt cylinder 92 extending between on the side of the rests 86 and the side of the tilt stand 90. A base plate 94 is fastened to the upper surface of the tilt stand 90, and the drive mechanism 15 is mounted on the base plate 94. Thus, according to the actuation of the tilt cylinder 92, the tilt stand 90 tilts about the pivot shafts 88. According to the tilt of the tilt stand 90, the head portion 14 and the drive mechanism 15 tilt integrally.

Figure 3:
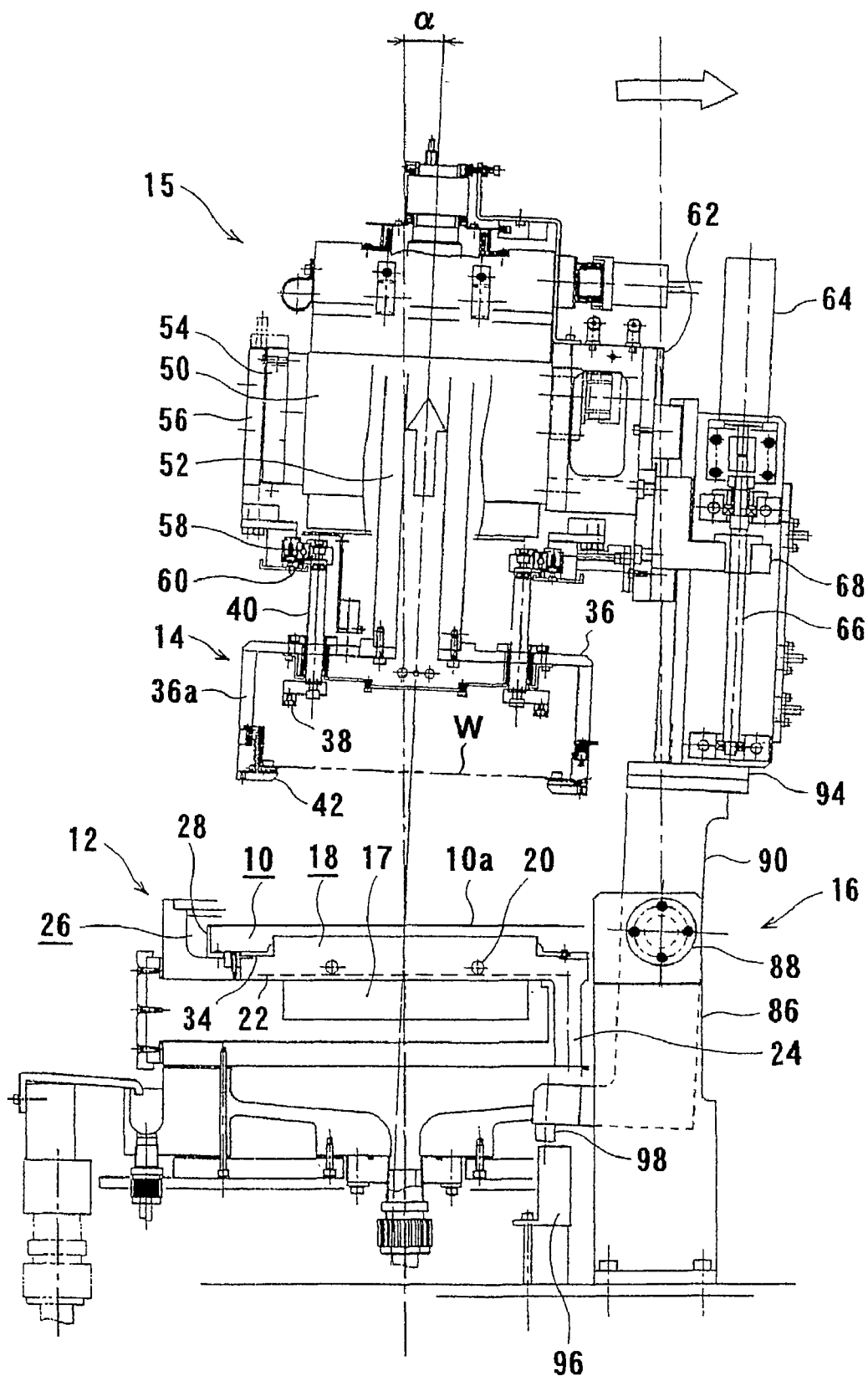
FIG. 3 is a front view showing the plating apparatus with a head portion being raised and further tilted.
Figure 4:
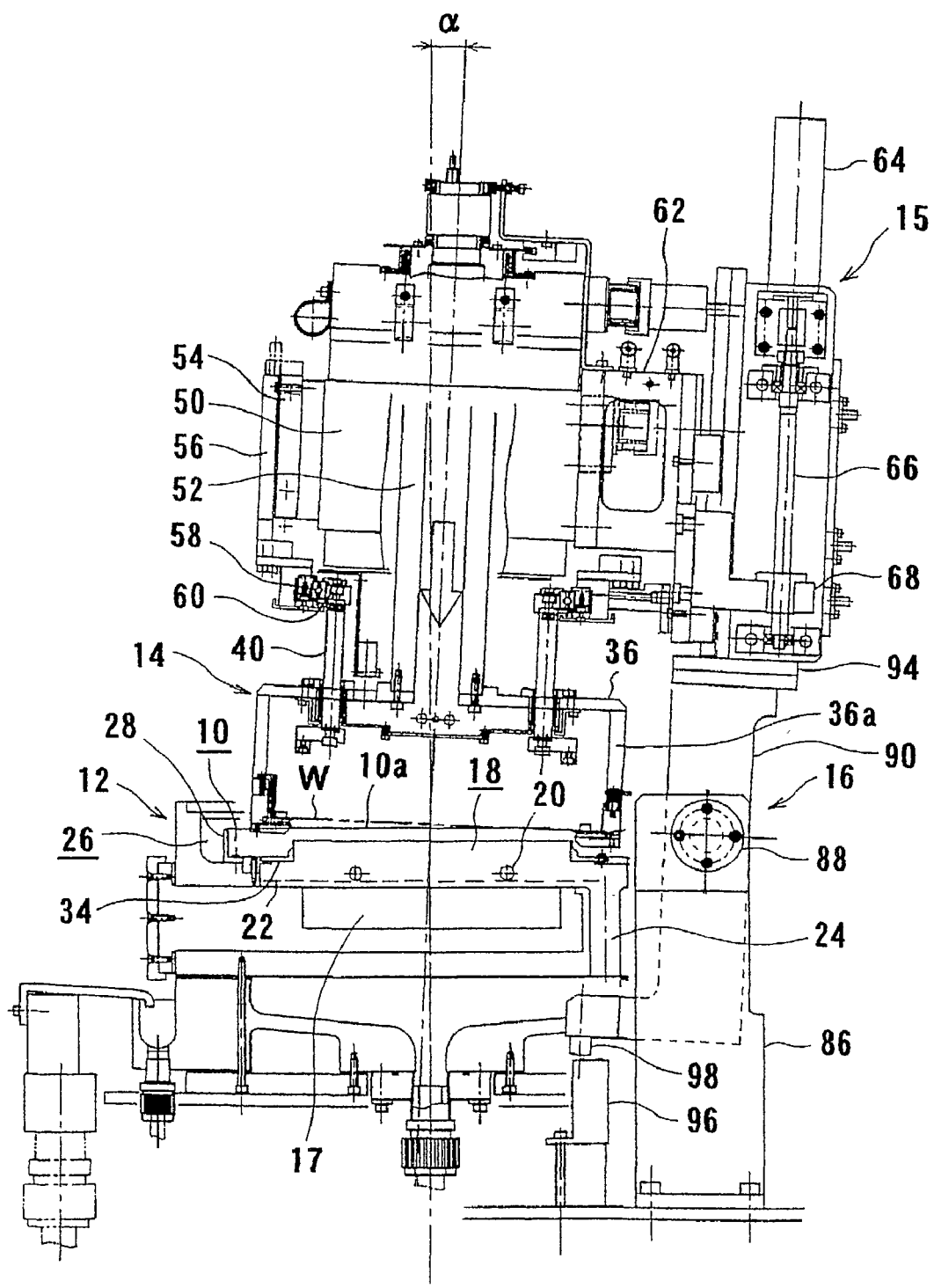
FIG. 4 is a front view showing the plating apparatus with the head portion being tilted and lowered.

That is, the plating apparatus can be in two states, an upright state and a tilt state. In the upright state, as shown in FIG. 1, the output shaft 52 of the rotating motor 50 of the drive mechanism 15 and the ball screw 66 both head in the vertical direction, the head portion 14 holds the substrate W horizontally, and the substrate W can be rotated and raised or lowered in this horizontal state. In the tilt state, as shown in FIGS. 3 and 4, the output shaft 52 of the rotating motor 50 of the drive mechanism 15 and the ball screw 66 both tilt at a tilt angle α with respect to the vertical direction, the head portion 14 holds the substrate W in an inclined manner at the tilt angle α with respect to the horizontal plane, and in this inclined state the substrate W can be rotated about the axis of the output shaft 52 of the rotating motor 50 and raised or lowered along this axis. The tilt angle α is preferably ranging from 2° to 10°, and is set at 20° 30' in this embodiment.

The pivot shafts 88 are disposed so as to be located in substantially the same plane as a plane formed by the overflow surface (liquid surface) 10a of the plating liquid 10 held in the plating bath 12. By this arrangement, the range in which the head portion 14 and the drive mechanism 15 tilt is maximally narrowed to achieve the small, compact size of the plating apparatus.

A stopper 96 is provided on the side of the floor surface, while a stopper piece 98 is provided on the side of the tilt stand 90, respectively. When the output shaft 52 of the rotating motor 50 of the drive mechanism 15 and the ball screw 66 both head in the vertical direction and stand in the upright state, the stopper piece 98 contacts the stopper 96, maintaining this state and keeping the tilt stand 90 from tilting in the reverse direction.

Figure 10A:
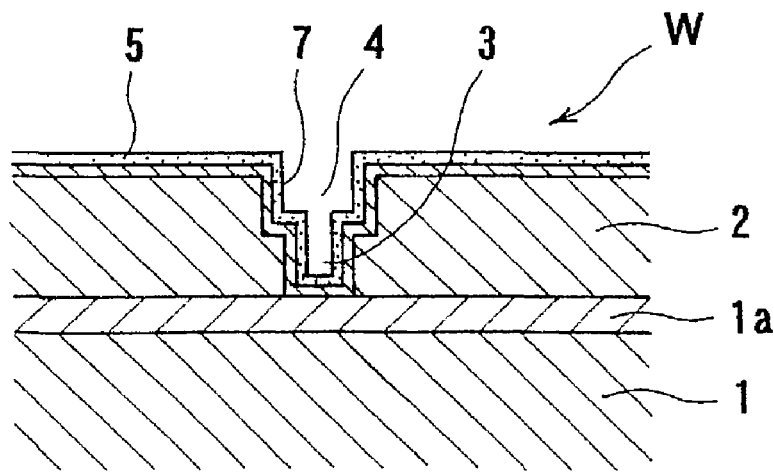
FIGS. 10A to 10C are sectional views showing an example of a process for performing plating by the plating apparatus of the present invention.

Next will follow a description of plating process by the plating apparatus as plating with copper or its alloy for the formation of an interconnection circuit on a semiconductor substrate. In a substrate W as an object to be treated, as shown in FIG. 10A, a conductive layer 1a, and an insulating film 2 of $SiO_2$ are deposited on a semiconductor substrate 1 having a semiconductor circuit device formed therein. Then, a contact hole 3 and a trench 4 for an interconnection are formed in the insulating film 2 by lithography and etching technology, and a barrier layer 5 of TaN or the like and a copper seed layer 7 are formed thereon.

When the substrate W is transferred to the plating apparatus, the substrate W held in such a state that the surface of the substrate W face downwardly by attraction hand is inserted into the housing 36 through its opening 36a, in the plating position with the head portion 14 being lowered as shown in FIG. 1. The attraction hand is moved downward, and then vacuum attraction is released to place the substrate W on the substrate holding portion 42 of the housing 36. Then, the attraction hand is raised and withdrawn from the housing 36. Then, the press ring 38 is lowered to sandwich the peripheral edge portion of the substrate W between the substrate holding portion 42 and the lower surfaces of the press ring 38 and hold the substrate W horizontally.

Then, as shown in FIG. 3, the elevating motor 64 of the drive mechanism 15 is driven to raise the head portion 14, and the tilt cylinder 92 is actuated to tilt the head portion 14 and the drive mechanism 15 integrally such that the output shaft 52 of the rotating motor 50 and the ball screw 66 incline at the tilt angle α to the vertical direction.

In the plating bath 12, the plating liquid in a relatively large volume of, for example, about 5 to 30 L/min, preferably about 15 to 25 L/min is ejected through the plating liquid ejection nozzles 20 to raise the liquid level of the plating liquid 10 and to form upwardly bulging flows of the plating liquid in the plating liquid 10 within the plating chamber 18. The plating liquid 10 which has overflowed the plating chamber 18 is recovered through the overflow channel 26.

In this state, the substrate W held obliquely relative to the horizontal plane, as shown in FIG. 4, is rotated about the axis of the rotating motor 50 at a rotational speed of, for example, about 10 to 250 rpm, preferably abut 40 to 200 rpm, and lowered along this axis at a speed of, for example, about 10 to 250 mm/sec, preferably 50 mm/sec, with a plating electric current being passed between the anode 17 and the seed layer 7, as the cathode, formed on the surface of the substrate W. If the rotational speed of the substrate is less than 10 rpm, the effect of suppressing remaining air bubbles declines. If the rotational speed of the substrate is higher than 250 rpm, the plating liquid froths up. More preferably, the rotational speed of the substrate is 100 to 200 rpm. As the lowering speed of the substrate increases, the time required for contact of the substrate with the plating liquid can be shortened, and the formation of a uniform film becomes easier. However, too high a lowering speed results in the upsizing of the plating apparatus.

The lower surface (the surface to be plated) of the substrate W first contacts a central part of the bulgy overflow surface (liquid surface) 10a formed by flows of the plating liquid, and further descends. Since the substrate W contacts the overflow surface 10a of the plating liquid in a state that the substrate is inclined relative to the horizontal plane, resistance which the substrate W receives from the plating liquid during descent of the substrate is reduced. Thus, this operation takes place smoothly. Furthermore, the area of contact gradually spreads outward. At the same time, a centrifugal force associated with the rotation of the substrate W works, whereby air bubbles below the surface to be plated are discharged to the outside.

After more than a half of the substrate W is immersed in the plating liquid 10, the tilt cylinder 92 is actuated in a manner contrary to the above-described manner, with the substrate W being raised or not being raised. By this procedure, the substrate W in an inclined state relative to the horizontal plane is returned to the horizontal state, namely, the state shown in FIG. 1, whereby the entire surface, to be plated, of the substrate W is immersed in the plating liquid 10. This operation is performed smoothly like the aforementioned operation, and air bubbles below the surface, to be plated, of the substrate are also discharged to the outside.

This state is maintained for a predetermined period of time, and the plating process is completed. After energization is stopped, the amount of the plating liquid supplied is decreased so that the plating liquid flows to the outside through the first plating liquid discharge port 24 and the second plating liquid discharge port 30 communicating with the through-holes 32 for liquid level control which are located above the plating liquid ejection nozzles 20, as shown in FIG. 7D. By this manner, the head portion 14 and the substrate W held thereby are exposed above the surface of the plating liquid. With the head portion 14 and the substrate W held thereby being situated above the surface of the plating liquid, the head portion 14 and the substrate W are rotated at a high speed (e.g., 500 to 800 rpm) to dehydrate the plating liquid by a centrifugal force. After the dehydration of the plating liquid is completed, the housing 36 is pointed in a predetermined direction, and the rotation of the head portion 14 is stopped.

Figure 10B:
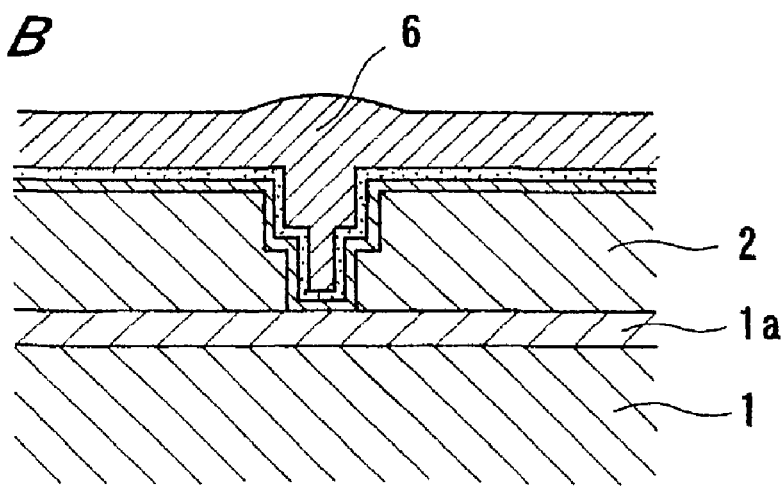
Figure 10C:
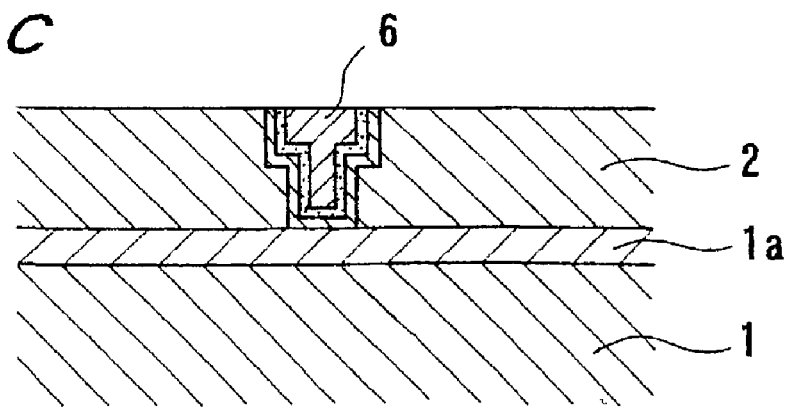

By the above-described plating process, the contact hole 3 and the trench 4 of the semiconductor substrate W are filled with copper, as shown in FIG. 10B. Then, a copper film 6 and the barrier layer 5 deposited on the insulating film 2 is removed by chemical mechanical polishing (CMP), thus making the surface of the copper film 6 filled into the contact hole 3 and the trench 4 for an interconnection lie flush with the surface of the insulating film 2. In this manner, an interconnection composed of the copper film 6 is formed as shown in FIG. 10C.

After the head portion 14 is completely stopped, the press ring 38 is raised. Then, the attraction hand is inserted into the housing 36 through its opening 36a, with the attraction surface of the attraction hand facing downward. The attraction hand is lowered to a position at which the attraction hand can attract the substrate. The substrate is vacuum attracted by the attraction hand, and the attraction hand is moved to a position the upper position of the opening 36a of the housing 36, whereupon the attraction hand and the substrate held thereby are taken out through the opening 36a of the housing 36.

According to this embodiment, energization can be started based on the time when the descent of the head portion 14 is initiated. Thus, completion of contact with the plating liquid and start of energization can be performed with close timings, thus preventing etching of the seed layer due to its contact with the plating liquid during a period without energization. Hence, the filling properties of the resulting pattern and the uniformity of the film are improved. Furthermore, the speed of contact of the substrate W with the plating liquid is so high that the difference in time between the start of contact with the plating liquid and the completion of contact with the plating liquid is decreased. Because of this advantage as well, the filling properties and the film uniformity are improved.

Figure 11:
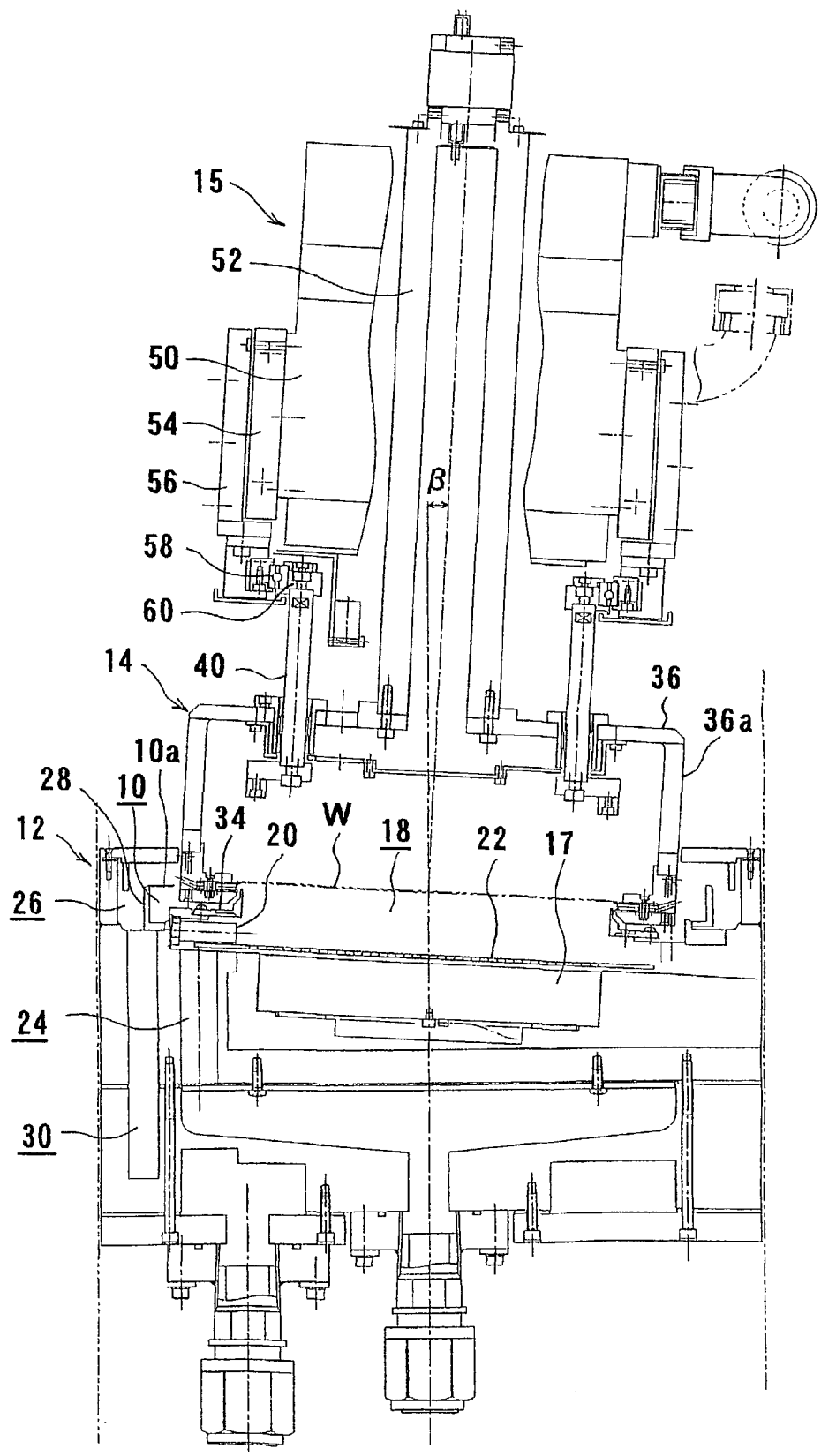
FIG. 11 is a front view showing a plating apparatus according to a second embodiment of the present invention.

FIG. 11 shows a plating apparatus according to a second embodiment of the present invention. The plating apparatus is configured such that a rotating motor 50 of a drive mechanism 15 is disposed, with an output shaft 52 of the rotating motor 50 being inclined at an angle of $\beta$ with respect to a vertical direction. By this arrangement, a substrate W is held by a housing 36 of a head portion 14 so as to be inclined at an angle of $\beta$ with respect to the horizontal plane. In agreement with this angle $\beta$, an anode 17 placed within a plating bath 12 is also inclined at an angle of $\beta$ with respect to the horizontal plane so as to be parallel to the substrate W held by the housing 36. This angle $\beta$ is desirably ranging from 1° to 10°, and set at 3° in the present embodiment. The drive mechanism 15 is provided with an elevating device (not shown) for moving vertically the head portion 14 along the axis of the output shaft 52 of the rotating motor 50. Other features are substantially the same as in the first embodiment.

An example of usage of this plating apparatus will be described with reference to FIGS. 12A to 12F.

Figure 12:
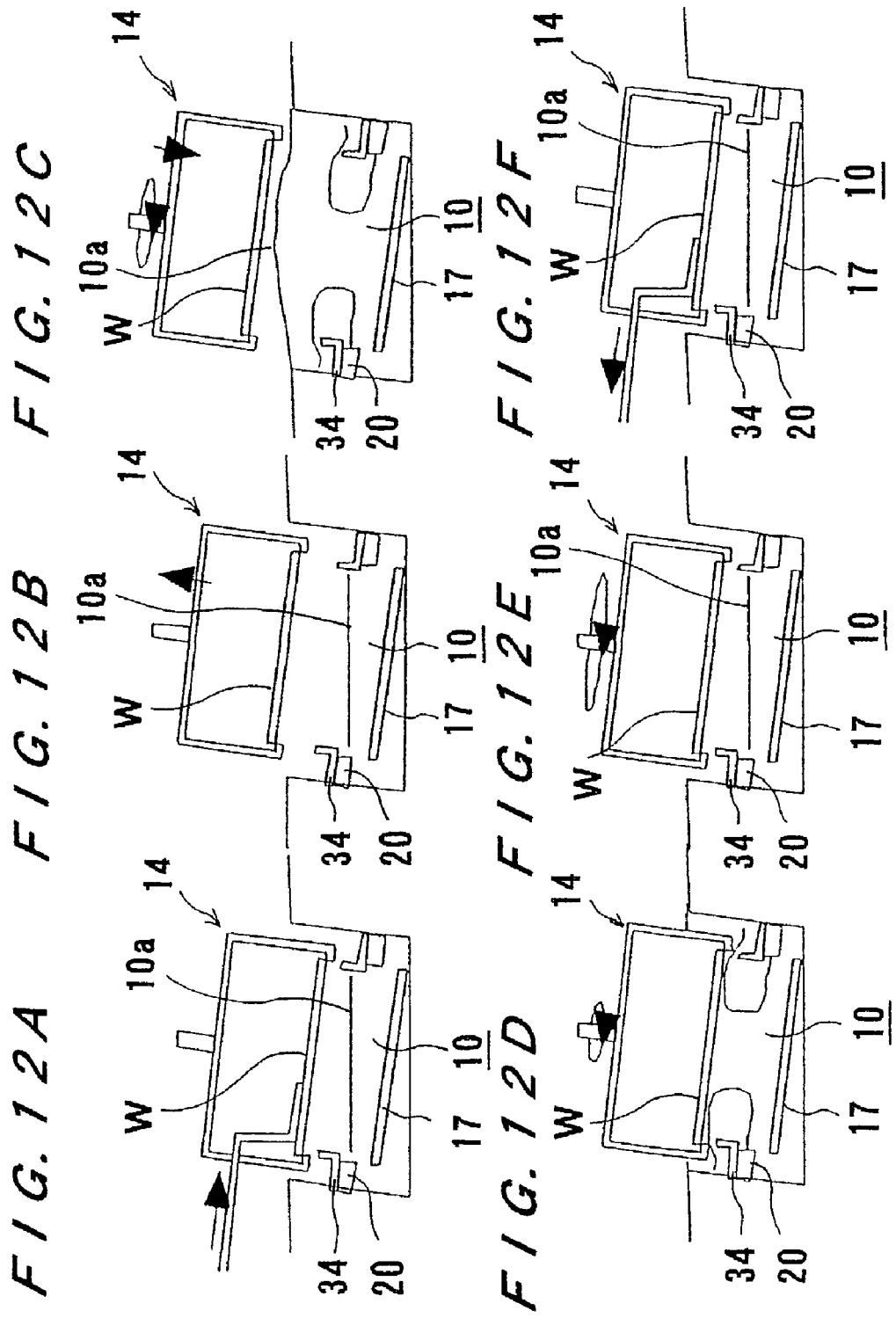
FIGS. 12A to 12F are sectional views showing plating by the plating apparatus shown in FIG. 11 in the sequence of steps.
Figure 13:
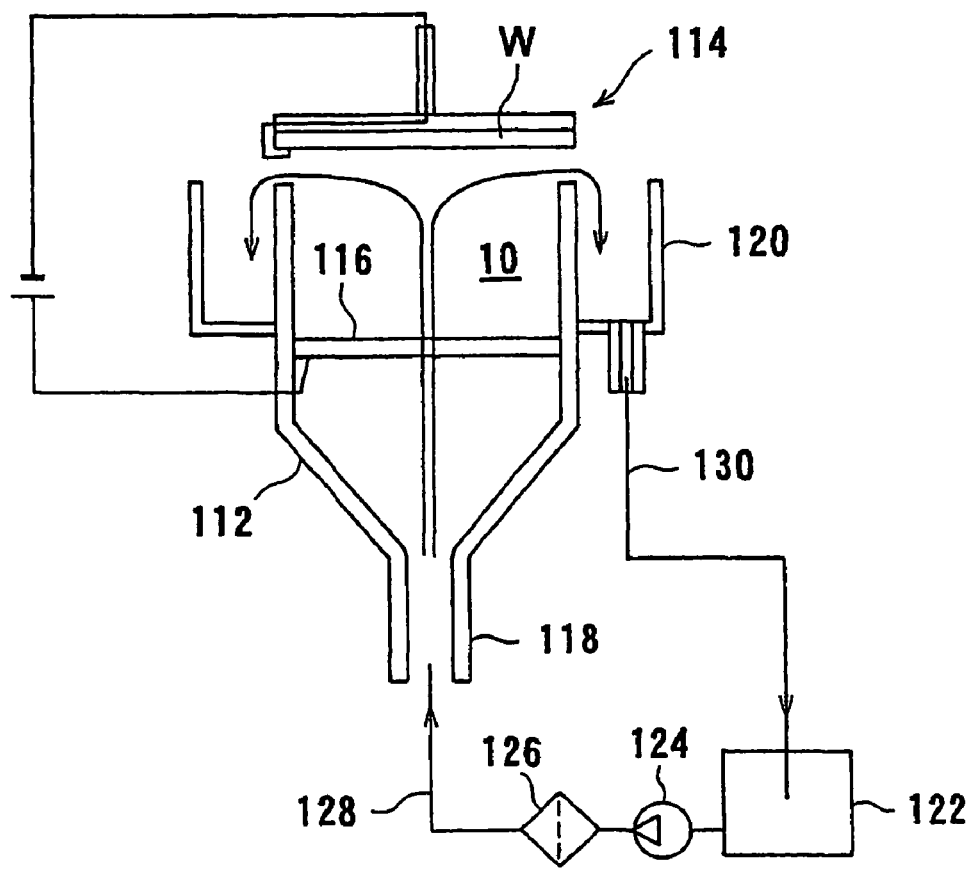
FIG. 13 is a vertical sectional front view of a conventional jet plating apparatus.

The substrate W, with its surface to be plated facing downward, is inserted into and held in the housing 36, in the plating position with the head portion 14 being lowered as shown in FIG. 12A. Then, the head portion 14 is raised by, for example, about 20 to 30 mm, as shown in FIG. 12B. Then, a plating liquid 10 is poured into a plating chamber 18 of a plating bath 12 to raise the liquid level of the plating liquid and stabilize the plating liquid at a flow rate during the plating process.

In this state, the substrate W is rotated and lowered via the head portion 14, as shown in FIG. 12C, with a plating electric current being passed between the anode 17 and a seed layer 7, as the cathode, formed on the surface of the substrate W. When the substrate W descends to the plating position shown in FIG. 12D, descent of the substrate is stopped. During descent of the substrate W to the plating position, a central part of its surface to be plated contacts the overflow surface (liquid surface) 10a of the plating liquid 10. While air bubbles below the surface, to be plated, of the substrate are being removed, the area of contact gradually spreads outward. At a time when the substrate W contacts the overflow surface (liquid surface) 10a of the plating liquid 10, an electric current flows so that plating process starts.

Upon completion of plating process, the supply of the electric current is stopped, and the liquid level of the plating liquid 10 is lowered to expose the substrate W above the plating liquid, as shown in FIG. 12E. The substrate W is rotated at a high speed to dehydrate the plating liquid. Then, the substrate W after the dehydration of the plating liquid is withdrawn from the housing 36 by a robot hand, as shown in FIG. 12F.

According to the present invention, as described above, the surface, to be plated, of the substrate is inclined relative to the overflow surface of the plating liquid while the surface to be plated is contacting the plating liquid. By this manner, the contact of the plating liquid with the surface, to be plated, of the substrate can be made smoothly, and this operation can be performed promptly. Furthermore, air bubbles can be inhibited from remaining on the surface, to be plated, of the substrate, whereby defects, such as a deficiency in the plated film, can be prevented.

In the above embodiments, although copper is used as the plating material to fill the contact hole and the trench, other metal such as silver and its alloy may be used as the plating material. Furthermore, this plating apparatus is adapted to form a metal layer on the substrate, and to conduct an electroless-plating process.

Figure 14:
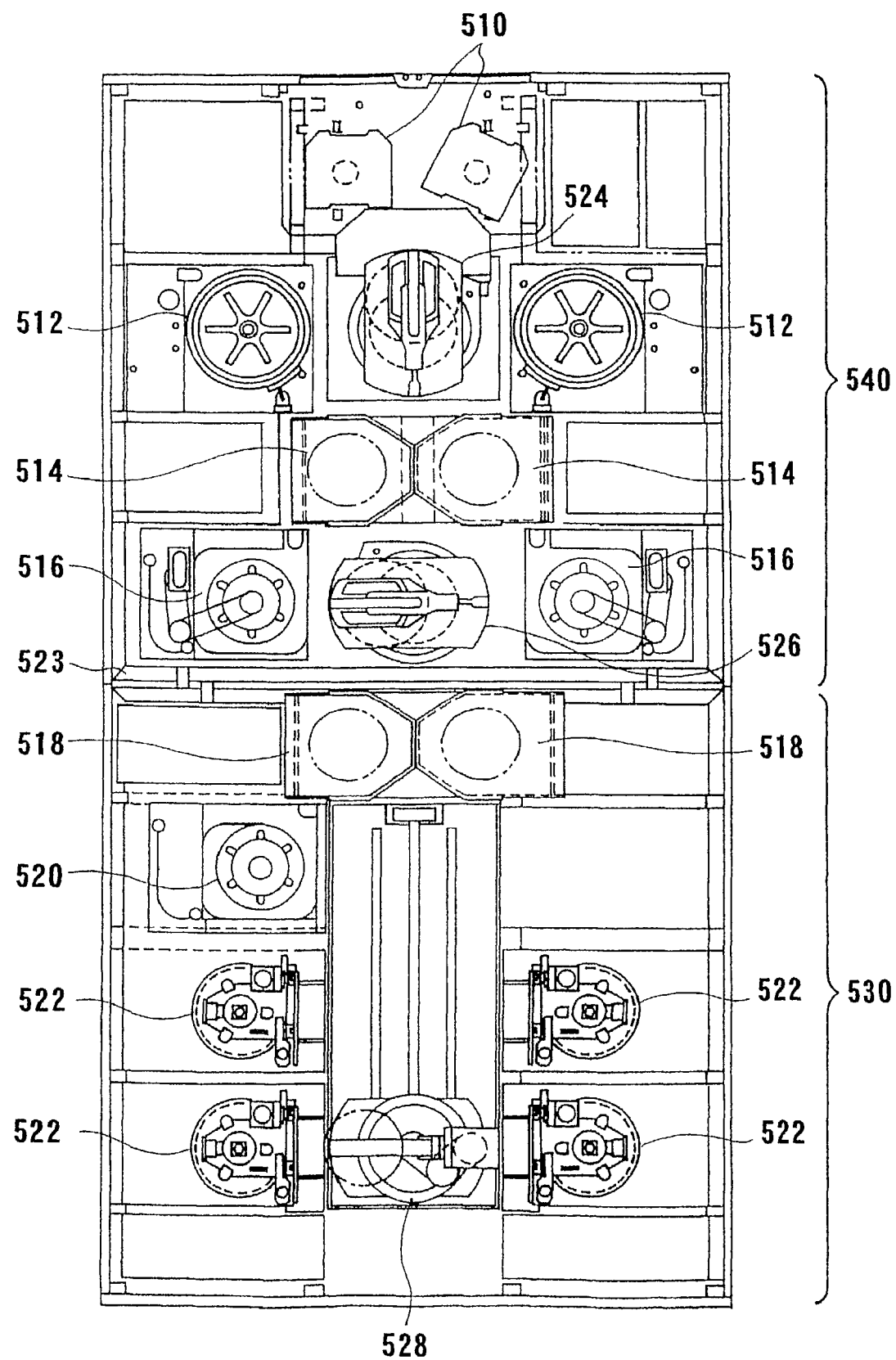
FIG. 14 is a plan view of an example of a substrate plating apparatus.

FIG. 14 is a plan view of an example of a substrate plating apparatus. The substrate plating apparatus comprises loading/unloading sections 510, each pair of cleaning/drying sections 512, first substrate stages 514, bevel-etching/chemical cleaning sections 516 and second substrate stages 518, a washing section 520 provided with a mechanism for reversing the substrate through 180°, and four plating apparatuses 522. The plating substrate apparatus is also provided with a first transporting device 524 for transporting a substrate between the loading/unloading sections 510, the cleaning/drying sections 512 and the first substrate stages 514, a second transporting device 526 for transporting a substrate between the first substrate stages 514, the bevel-etching/chemical cleaning sections 516 and the second substrate stages 518, and a third transporting device 528 for transporting the substrate between the second substrate stages 518, the washing section 520 and the plating apparatuses 522.

The substrate plating apparatus has a partition wall 523 for dividing the plating apparatus into a plating space 530 and a clean space 540. Air can individually be supplied into and exhausted from each of the plating space 530 and the clean space 540. The partition wall 523 has a shutter (not shown) capable of opening and closing. The pressure of the clean space 540 is lower than the atmospheric pressure and higher than the pressure of the plating space 530. This can prevent the air in the clean space 540 from flowing out of the plating apparatus and can prevent the air in the plating space 530 from flowing into the clean space 540.

Figure 15:
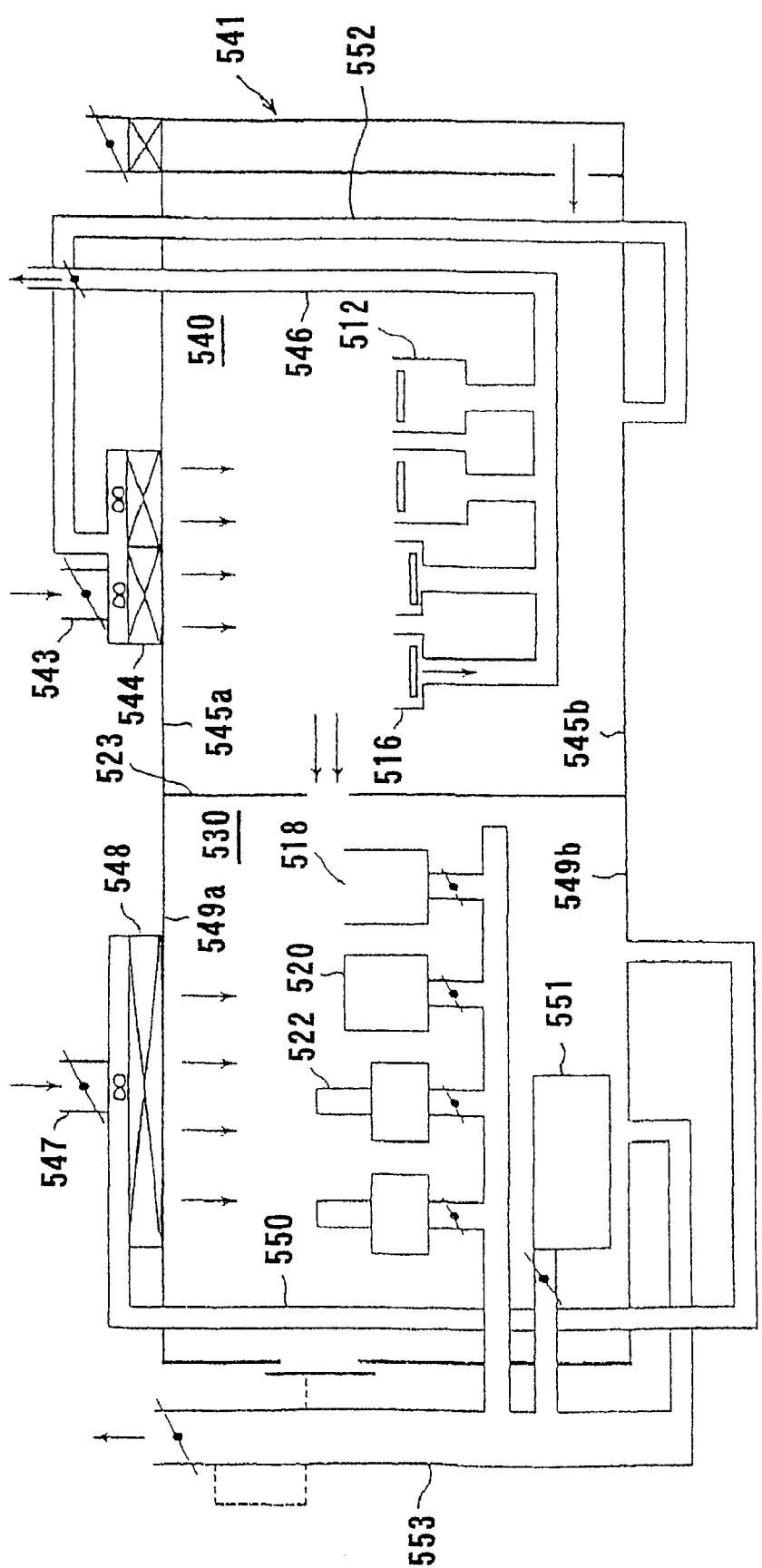
FIG. 15 is a schematic view showing airflow in the substrate plating apparatus shown in FIG. 14.

FIG. 15 is a schematic view showing an air current in the plating substrate apparatus. In the clean space 540, a fresh external air is introduced through a pipe 543 and pushed into the clean space 540 through a high-performance filter 544 by a fan. Hence, a down-flow clean air is supplied from a ceiling 545a to positions around the cleaning/drying sections 512 and the bevel-etching/chemical cleaning sections 516. A large part of the supplied clean air is returned from a floor 545b through a circulation pipe 552 to the ceiling 545a, and pushed again into the clean space 540 through the high-performance filter 544 by the fan, to thus circulate in the clean space 540. A part of the air is discharged from the cleaning/drying sections 512 and the bevel-etching/chemical cleaning sections 516 through a pipe 546 to the exterior, so that the pressure of the clean space 540 is set to be lower than the atmospheric pressure.

The plating space 530 having the washing sections 520 and the plating apparatuses 522 therein is not a clean space (but a contamination zone). However, it is not acceptable to attach particles to the surface of the substrate. Therefore, in the plating space 530, a fresh external air is introduced through a pipe 547, and a down-flow clean air is pushed into the plating space 530 through a high-performance filter 548 by a fan, for thereby preventing particles from being attached to the surface of the substrate. However, if the whole flow rate of the down-flow clean air is supplied by only an external air supply and exhaust, then enormous air supply and exhaust are required. Therefore, the air is discharged through a pipe 553 to the exterior, and a large part of the down-flow is supplied by a circulating air through a circulation pipe 550 extended from a floor 549b, in such a state that the pressure of the plating space 530 is maintained to be lower than the pressure of the clean space 540.

Thus, the air returned to a ceiling 549a through the circulation pipe 550 is pushed again into the plating space 530 through the high-performance filter 548 by the fan. Hence, a clean air is supplied into the plating space 530 to thus circulate in the plating space 530. In this case, air containing chemical mist or gas emitted from the washing sections 520, the plating sections 522, the third transporting device 528, and a plating liquid regulating tank 551 is discharged through the pipe 553 to the exterior. Thus, the pressure of the plating space 530 is controlled so as to be lower than the pressure of the clean space 540.

Figure 16:
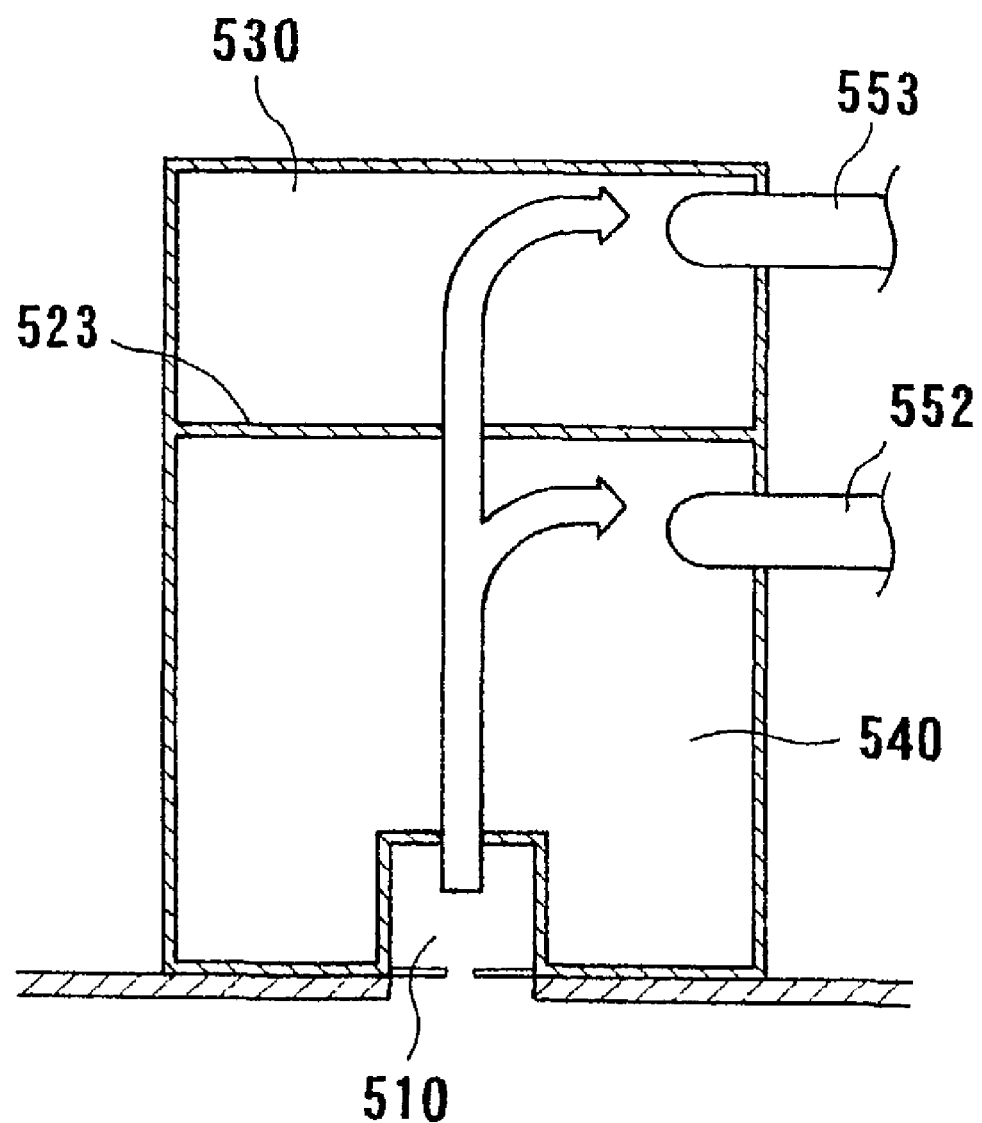
FIG. 16 is a cross-sectional view showing airflows among areas in the substrate plating apparatus shown in FIG. 14.

The pressure in the loading/unloading sections 510 is higher than the pressure in the clean space 540 which is higher than the pressure in the plating space 530. When the shutters (not shown) are opened, therefore, air flows successively through the loading/unloading sections 510, the clean space 540, and the plating space 530, as shown in FIG. 16. Air discharged from the clean space 540 and the plating space 530 flows through the ducts 552, 553 into a common duct 554 (see FIG. 17) which extends out of the clean room.

FIG. 17 shows in perspective the substrate plating apparatus shown in FIG. 14, which is placed in the clean room. The loading/unloading sections 510 includes a side wall which has a cassette transfer port 555 defined therein and a control panel 556, and which is exposed to a working zone 558 that is compartmented in the clean room by a partition wall 557. The partition wall 557 also compartments a utility zone 559 in the clean room in which the substrate plating apparatus is installed. Other sidewalls of the substrate plating apparatus are exposed to the utility zone 559 whose air cleanness is lower than the air cleanness in the working zone 558.

Figure 18:
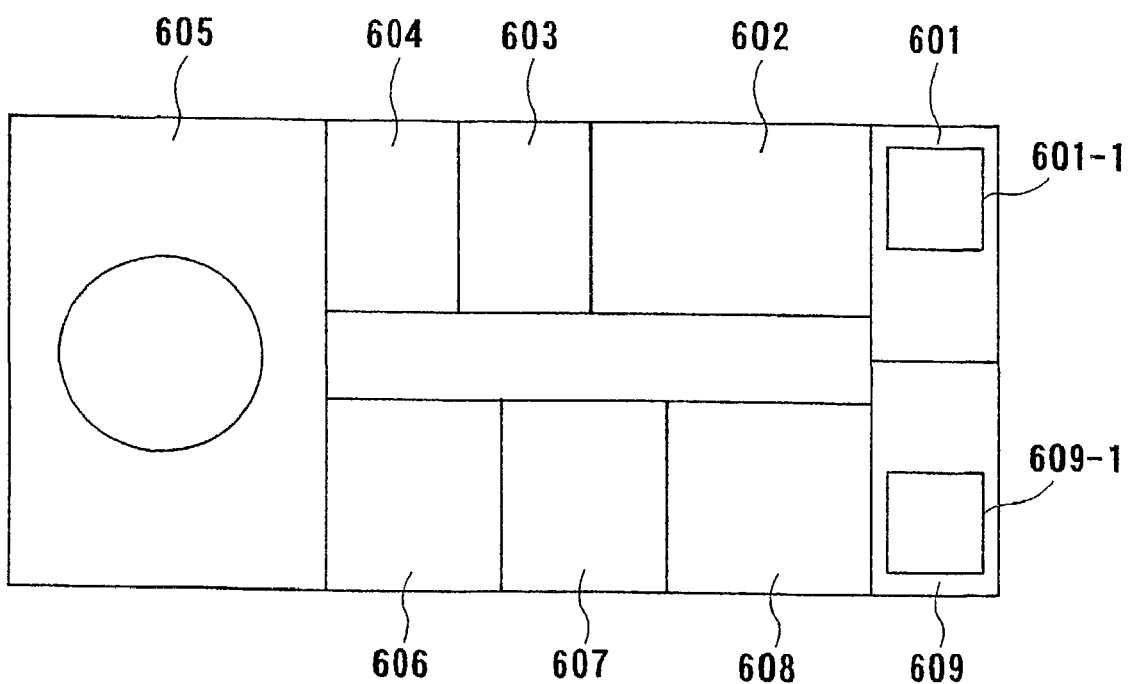
FIG. 18 is a plan view of another example of a substrate plating apparatus.

FIG. 18 is a plan view of another example of a substrate plating apparatus. The substrate plating apparatus shown in FIG. 18 comprises a loading unit 601 for loading a semiconductor substrate, a copper plating chamber 602 for plating a semiconductor substrate with copper, a pair of water cleaning chambers 603, 604 for cleaning a semiconductor substrate with water, a chemical mechanical polishing unit 605 for chemically and mechanically polishing a semiconductor substrate, a pair of water cleaning chambers 606, 607 for cleaning a semiconductor substrate with water, a drying chamber 608, for drying a semiconductor substrate, and an unloading unit 609 for unloading a semiconductor substrate with an interconnection film thereon. The substrate plating apparatus also has a substrate transfer mechanism (not shown) for transferring semiconductor substrates to the chambers 602, 603, 604, the chemical mechanical polishing unit 605, the chambers 606, 607, 608, and the unloading unit 609. The loading unit 601, the chambers 602, 603, 604, the chemical mechanical polishing unit 605, the chambers 606, 607, 608, and the unloading unit 609 are combined into a single unitary arrangement as apparatus.

The substrate plating apparatus operates as follows: The substrate transfer mechanism transfers a semiconductor substrate W on which an interconnection film has not yet been formed from a substrate cassette 601-1 placed in the loading unit 601 to the copper plating chamber 602. In the copper plating chamber 602, a plated copper film is formed on a surface of the semiconductor substrate W having an interconnection region composed of an interconnection trench and an interconnection hole (contact hole).

After the plated copper film is formed on the semiconductor substrate W in the copper plating chamber 602, the semiconductor substrate W is transferred to one of the water cleaning chambers 603, 604 by the substrate transfer mechanism and cleaned by water in one of the water cleaning chambers 603, 604. The cleaned semiconductor substrate W is transferred to the chemical mechanical polishing unit 605 by the substrate transfer mechanism. The chemical mechanical polishing unit 605 removes the unwanted plated copper film from the surface of the semiconductor substrate W, leaving a portion of the plated copper film in the interconnection trench and the interconnection hole. A barrier layer made of TiN or the like is formed on the surface of the semiconductor substrate W, including the inner surfaces of the interconnection trench and the interconnection hole, before the plated copper film is deposited.

Then, the semiconductor substrate W with the remaining plated copper film is transferred to one of the water cleaning chambers 606, 607 by the substrate transfer mechanism and cleaned by water in one of the water cleaning chambers 607, 608. The cleaned semiconductor substrate W is then dried in the drying chamber 608, after which the dried semiconductor substrate W with the remaining plated copper film serving as an interconnection film is placed into a substrate cassette 609-1 in the unloading unit 609.

Figure 19:
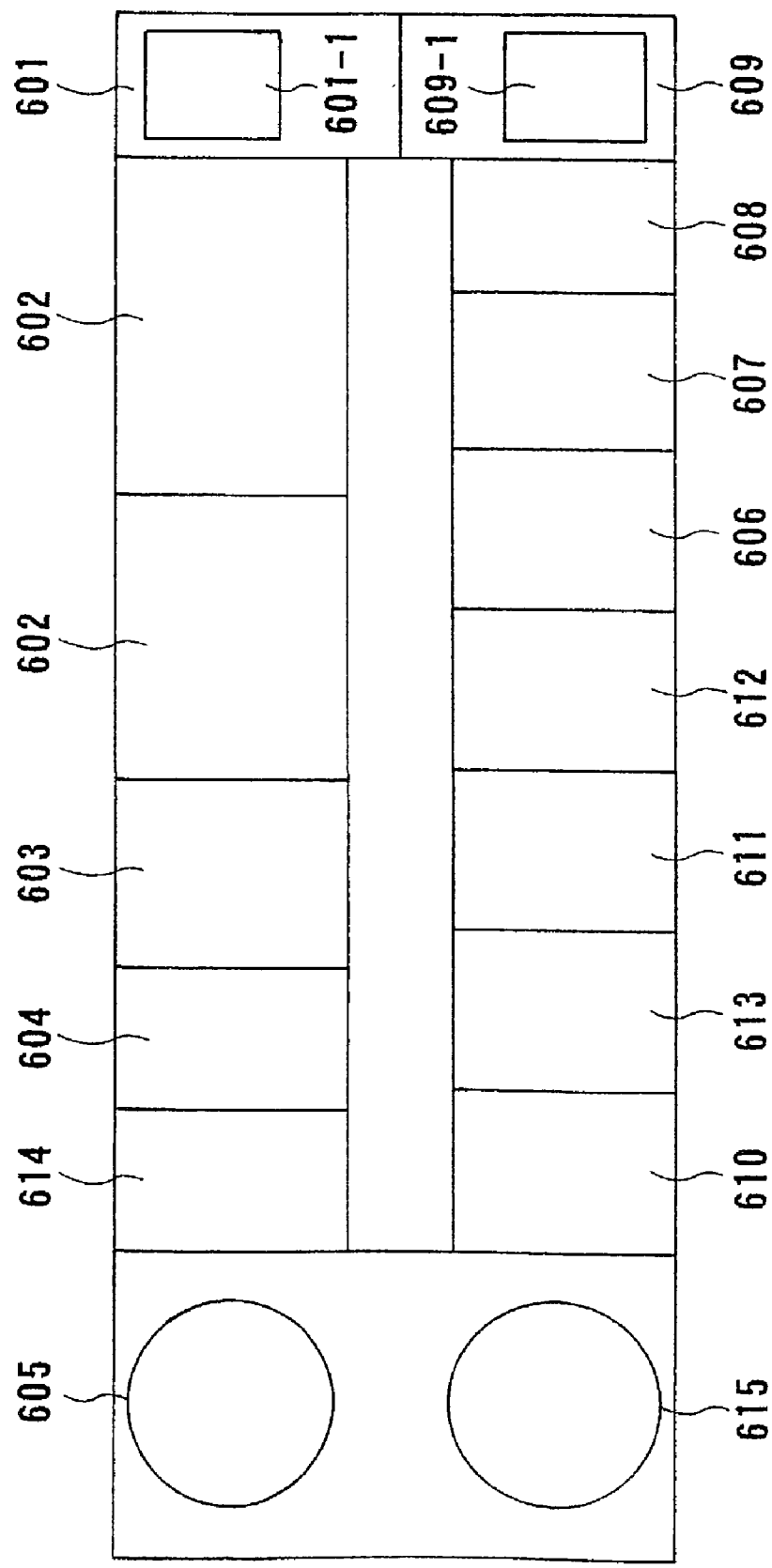
FIG. 19 is a plan view of still another example of a substrate plating apparatus.

FIG. 19 shows a plan view of still another example of a substrate plating apparatus. The substrate plating apparatus shown in FIG. 19 differs from the substrate plating apparatus shown in FIG. 18 in that it additionally includes a copper plating chamber 602, a water cleaning chamber 610, a pretreatment chamber 611, a protective layer plating chamber 612 for forming a protective plated layer on a plated copper film on a semiconductor substrate, water cleaning chamber 613, 614, and a chemical mechanical polishing unit 615. The loading unit 601, the chambers 602, 602, 603, 604, 614, the chemical mechanical polishing unit 605, 615, the chambers 606, 607, 608, 610, 611, 612, 613, and the unloading unit 609 are combined into a single unitary arrangement as an apparatus.

The substrate plating apparatus shown in FIG. 19 operates as follows: A semiconductor substrate W is supplied from the substrate cassette 601-1 placed in the loading unit 601 successively to one of the copper plating chambers 602, 602. In one of the copper plating chamber 602, 602, a plated copper film is formed on a surface of a semiconductor substrate W having an interconnection region composed of an interconnection trench and an interconnection hole (contact hole). The two copper plating chambers 602, 602 are employed to allow the semiconductor substrate W to be plated with a copper film for a long period of time. Specifically, the semiconductor substrate W may be plated with a primary copper film according to electroless-plating in one of the copper plating chamber 602, and then plated with a secondary copper film according to electroplating in the other copper plating chamber 602. The substrate plating apparatus may have more than two copper plating chambers.

The semiconductor substrate W with the plated copper film formed thereon is cleaned by water in one of the water cleaning chambers 603, 604. Then, the chemical mechanical polishing unit 605 removes the unwanted portion of the plated copper film from the surface of the semiconductor substrate W, leaving a portion of the plated copper film in the interconnection trench and the interconnection hole.

Thereafter, the semiconductor substrate W with the remaining plated copper film is transferred to the water cleaning chamber 610, in which the semiconductor substrate W is cleaned with water. Then, the semiconductor substrate W is transferred to the pretreatment chamber 611, and pretreated therein for the deposition of a protective plated layer. The pretreated semiconductor substrate W is transferred to the protective layer-plating chamber 612. In the protective layer plating chamber 612, a protective plated layer is formed on the plated copper film in the interconnection region on the semiconductor substrate W. For example, the protective plated layer is formed with an alloy of nickel (Ni) and boron (B) by electroless-plating.

After semiconductor substrate is cleaned in one of the water cleaning chamber 613, 614, an upper portion of the protective plated layer deposited on the plated copper film is polished off to planarize the protective plated layer, in the chemical mechanical polishing unit 615, After the protective plated layer is polished, the semiconductor substrate W is cleaned by water in one of the water cleaning chambers 606, 607, dried in the drying chamber 608, and then transferred to the substrate cassette 609-1 in the unloading unit 609.

Figure 20:
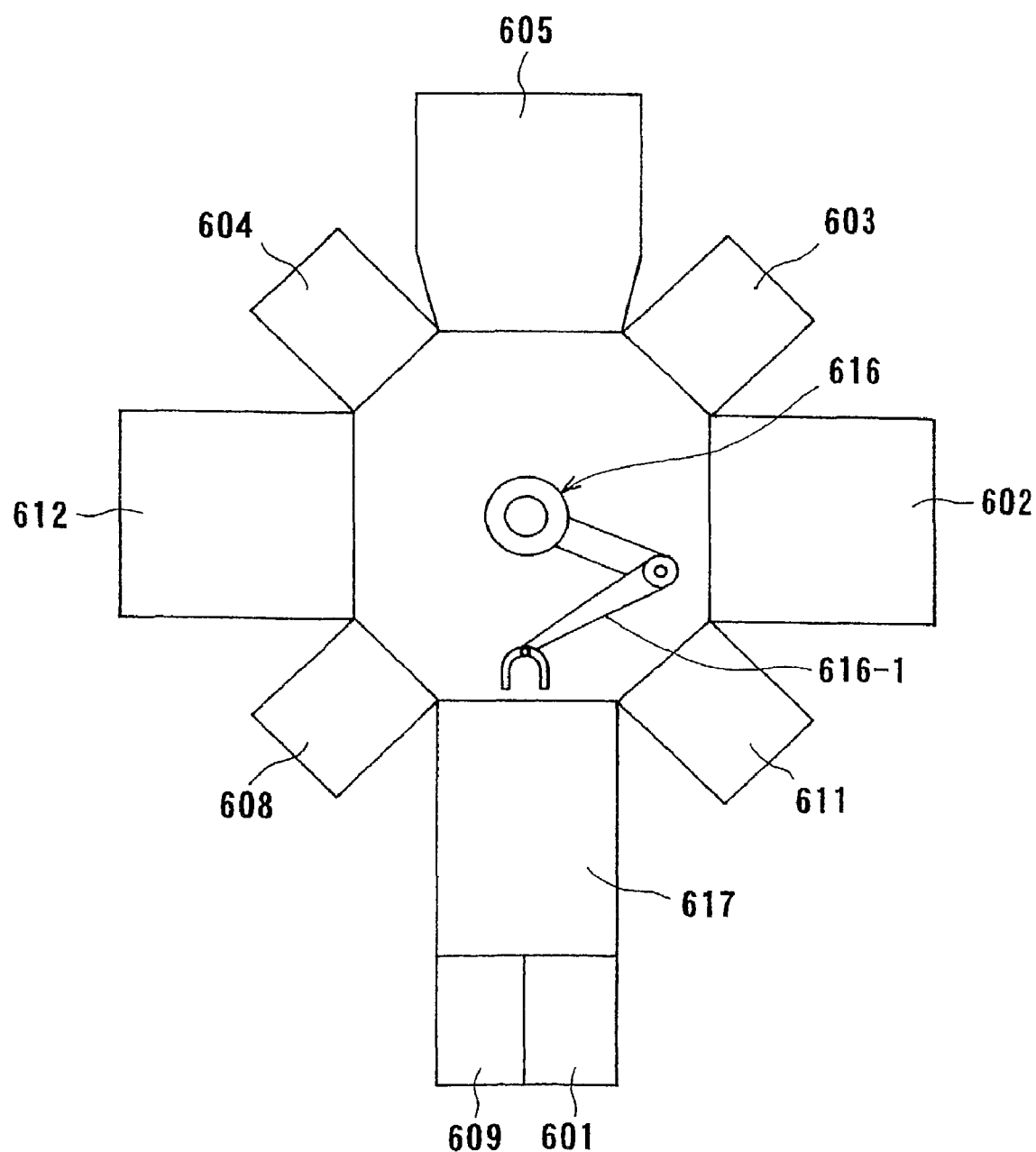
FIG. 20 is a plan view of still another example of a substrate plating apparatus.

FIG. 20 is a plan view of still another example of a substrate plating apparatus. As shown in FIG. 20, the substrate plating apparatus includes a robot 616 at its center which has a robot arm 616-1, and also has a copper plating chamber 602, a pair of water cleaning chambers 603, 604, a chemical mechanical polishing unit 605, a pretreatment chamber 611, a protective layer plating chamber 612, a drying chamber 608, and a loading/unloading station 617 which are disposed around the robot 616 and positioned within the reach of the robot arm 616-1. A loading unit 601 for loading semiconductor substrates and an unloading unit 609 for unloading semiconductor substrates is disposed adjacent to the loading/unloading station 617. The robot 616, the chambers 602, 603, 604, the chemical mechanical polishing unit 605, the chambers 608, 611, 612, the loading/unloading station 617, the loading unit 601, and the unloading unit 609 are combined into a single unitary arrangement as an apparatus.

The substrate plating apparatus shown in FIG. 20 operates as follows:

A semiconductor substrate to be plated is transferred from the loading unit 601 to the loading/unloading station 617, from which the semiconductor substrate is received by the robot arm 616-1 and transferred thereby to the copper plating chamber 602. In the copper plating chamber 602, a plated copper film is formed on a surface of the semiconductor substrate which has an interconnection region composed of an interconnection trench and an interconnection hole. The semiconductor substrate with the plated copper film formed thereon is transferred by the robot arm 616-1 to the chemical mechanical polishing unit 605. In the chemical mechanical polishing unit 605, the plated copper film is removed from the surface of the semiconductor substrate W, leaving a portion of the plated copper film in the interconnection trench and the interconnection hole.

The semiconductor substrate is then transferred by the robot arm 616-1 to the water-cleaning chamber 604, in which the semiconductor substrate is cleaned by water. Thereafter, the semiconductor substrate is transferred by the robot arm 616-1 to the pretreatment chamber 611, in which the semiconductor substrate is pretreated therein for the deposition of a protective plated layer. The pretreated semiconductor substrate is transferred by the robot arm 616-1 to the protective layer plating chamber 612. In the protective layer plating chamber 612, a protective plated layer is formed on the plated copper film in the interconnection region on the semiconductor substrate W. The semiconductor substrate with the protective plated layer formed thereon is transferred by the robot arm 616-1 to the water cleaning chamber 604, in which the semiconductor substrate is cleaned by water. The cleaned semiconductor substrate is transferred by the robot arm 616-1 to the drying chamber 608, in which the semiconductor substrate is dried. The dried semiconductor substrate is transferred by the robot arm 616-1 to the loading/unloading station 617, from which the plated semiconductor substrate is transferred to the unloading unit 609.

Figure 21:
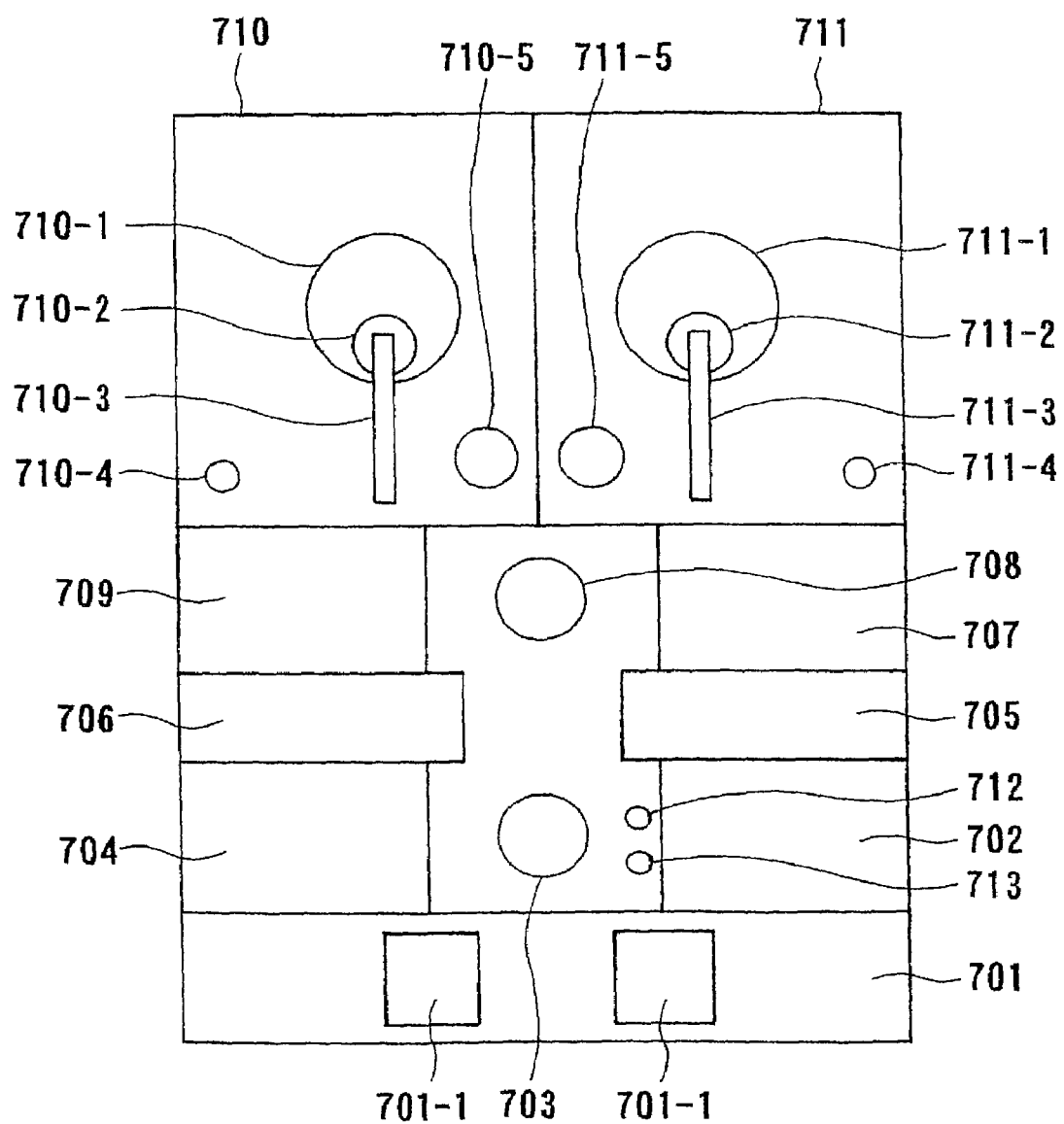
FIG. 21 is a view showing a plan constitution example of the semiconductor substrate processing apparatus.

FIG. 21 is a view showing the plan constitution of another example of a semiconductor substrate processing apparatus. The semiconductor substrate processing apparatus is of a constitution in which there are provided a loading/unloading section 701, a plated Cu film forming unit 702, a first robot 703, a third cleaning machine 704, a reversing machine 705, a reversing machine 706, a second cleaning machine 707, a second robot 708, a first cleaning machine 709, a first polishing apparatus 710, and a second polishing apparatus 711. A before-plating and after-plating film thickness measuring instrument 712 for measuring the film thicknesses before and after plating, and a dry state film thickness measuring instrument 713 for measuring the film thickness of a semiconductor substrate W in a dry state after polishing are placed near the first robot 703.

The first polishing apparatus (polishing unit) 710 has a polishing table 710-1, a top ring 710-2, a top ring head 710-3, a film thickness measuring instrument 710-4, and a pusher 710-5. The second polishing apparatus (polishing unit) 711 has a polishing table 711-1, a top ring 711-2, a top ring head 711-3, a film thickness measuring instrument 711-4, and a pusher 711-5.

A cassette 701-1 accommodating the semiconductor substrates W, in which a via hole and a trench for interconnect are formed, and a seed layer is formed thereon is placed on a loading port of the loading/unloading section 701. The first robot 703 takes out the semiconductor substrate W from the cassette 701-1, and carries the semiconductor substrate W into the plated Cu film forming unit 702 where a plated Cu film is formed. At this time, the film thickness of the seed layer is measured with the before-plating and after-plating film thickness measuring instrument 712. The plated Cu film is formed by carrying out hydrophilic treatment of the face of the semiconductor substrate W, and then Cu plating. After formation of the plated Cu film, rinsing or cleaning of the semiconductor substrate W is carried out in the plated Cu film forming unit 702.

When the semiconductor substrate W is taken out from the plated Cu film forming unit 702 by the first robot 703, the film thickness of the plated Cu film is measured with the before-plating and after-plating film thickness measuring instrument 712. The results of its measurement are recorded into a recording device (not shown) as record data on the semiconductor substrate, and are used for judgment of an abnormality of the plated Cu film forming unit 702. After measurement of the film thickness, the first robot 703 transfers the semiconductor substrate W to the reversing machine 705, and the reversing machine 705 reverses the semiconductor substrate W (the surface on which the plated Cu film has been formed faces downward). The first polishing apparatus 710 and the second polishing apparatus 711 perform polishing in a serial mode and a parallel mode. Next, polishing in the serial mode will be described.

In the serial mode polishing, a primary polishing is performed by the polishing apparatus 710, and a secondary polishing is performed by the polishing apparatus 711. The second robot 708 picks up the semiconductor substrate W on the reversing machine 705, and places the semiconductor substrate W on the pusher 710-5 of the polishing apparatus 710. The top ring 710-2 attracts the semiconductor substrate W on the pusher 710-5 by suction, and brings the surface of the plated Cu film of the semiconductor substrate W into contact with a polishing surface of the polishing table 710-1 under pressure to perform a primary polishing. With the primary polishing, the plated Cu film is basically polished. The polishing surface of the polishing table 710-1 is composed of foamed polyurethane such as IC1000, or a material having abrasive grains fixed thereto or impregnated therein. Upon relative movements of the polishing surface and the semiconductor substrate W, the plated Cu film is polished.

After completion of polishing of the plated Cu film, the semiconductor substrate W is returned onto the pusher 710-5 by the top ring 710-2. The second robot 708 picks up the semiconductor substrate W, and introduces it into the first cleaning machine 709. At this time, a chemical liquid may be ejected toward the face and backside of the semiconductor substrate W on the pusher 710-5 to remove particles therefrom or cause particles to be difficult to adhere thereto.

After completion of cleaning in the first cleaning machine 709, the second robot 708 picks up the semiconductor substrate W, and places the semiconductor substrate W on the pusher 711-5 of the second polishing apparatus 711. The top ring 711-2 attracts the semiconductor substrate W on the pusher 711-5 by suction, and brings the surface of the semiconductor substrate W, which has the barrier layer formed thereon, into contact with a polishing surface of the polishing table 711-1 under pressure to perform the secondary polishing. The constitution of the polishing table is the same as the top ring 711-2. With this secondary polishing, the barrier layer is polished. However, there may be a case in which a Cu film and an oxide film left after the primary polishing are also polished.

A polishing surface of the polishing table 711-1 is composed of foamed polyurethane such as IC1000, or a material having abrasive grains fixed thereto or impregnated therein. Upon relative movements of the polishing surface and the semiconductor substrate W, polishing is carried out. At this time, silica, alumina, ceria, on the like is used as abrasive grains or slurry. A chemical liquid is adjusted depending on the type of the film to be polished.

Detection of an end point of the secondary polishing is performed by measuring the film thickness of the barrier layer mainly with the use of the optical film thickness measuring instrument, and detecting the film thickness which has become zero, or the surface of an insulating film comprising $SiO_2$ shows up. Furthermore, a film thickness measuring instrument with an image processing function is used as the film thickness measuring instrument 711-4 provided near the polishing table 711-1. By use of this measuring instrument, measurement of the oxide film is made, the results are stored as processing records of the semiconductor substrate W, and used for judging whether the semiconductor substrate W in which secondary polishing has been finished can be transferred to a subsequent step or not. If the end point of the secondary polishing is not reached, re-polishing is performed. If over-polishing has been performed beyond a prescribed value due to any abnormality, then the semiconductor substrate processing apparatus is stopped to avoid next polishing so that defective products will not increase.

After completion of the secondary polishing, the semiconductor substrate W is moved to the pusher 711-5 by the top ring 711-2. The second robot 708 picks up the semiconductor substrate W on the pusher 711-5. At this time, a chemical liquid may be ejected toward the face and backside of the semiconductor substrate W on the pusher 711-5 to remove particles therefrom or cause particles to be difficult to adhere thereto.

The second robot 708 carries the semiconductor substrate W into the second cleaning machine 707 where cleaning of the semiconductor substrate W is performed. The constitution of the second cleaning machine 707 is also the same as the constitution of the first cleaning machine 709. The face of the semiconductor substrate W is scrubbed with the PVA sponge rolls using a cleaning liquid comprising pure water to which a surface active agent, a chelating agent, or a pH regulating agent is added. A strong chemical liquid such as DHF is ejected from a nozzle toward the backside of the semiconductor substrate W to perform etching of the diffused Cu thereon. If there is no problem of diffusion, scrubbing cleaning is performed with the PVA sponge rolls using the same chemical liquid as that used for the face.

After completion of the above cleaning, the second robot 708 picks up the semiconductor substrate W and transfers it to the reversing machine 706, and the reversing machine 706 reverses the semiconductor substrate W. The semiconductor substrate W which has been reversed is picked up by the first robot 703, and transferred to the third cleaning machine 704. In the third cleaning machine 704, megasonic water excited by ultrasonic vibrations is ejected toward the face of the semiconductor substrate W to clean the semiconductor substrate W. At this time, the face of the semiconductor substrate W may be cleaned with a known pencil type sponge using a cleaning liquid comprising pure water to which a surface active agent, a chelating agent, or a pH regulating agent is added. Thereafter, the semiconductor substrate W is dried by spin-drying.

As described above, if the film thickness has been measured with the film thickness measuring instrument 711-4 provided near the polishing table 711-1, then the semiconductor substrate W is not subjected to further process and is accommodated into the cassette placed on the unloading port of the loading/unloading section 771.

FIG. 22 is a view showing the plan constitution of another example of a semiconductor substrate processing apparatus. The substrate processing apparatus differs from the substrate processing apparatus shown in FIG. 21 in that a cap plating unit 750 is provided instead of the plated Cu film forming unit 702 in FIG. 21.

A cassette 701-1 accommodating the semiconductor substrates W formed plated Cu film is placed on a load port of a loading/unloading section 701. The semiconductor substrate W taken out from the cassette 701-1 is transferred to the first polishing apparatus 710 or second polishing apparatus 711 in which the surface of the plated Cu film is polished. After completion of polishing of the plated Cu film, the semiconductor substrate W is cleaned in the first cleaning machine 709.

After completion of cleaning in the first cleaning machine 709, the semiconductor substrate W is transferred to the cap plating unit 750 where cap plating is applied onto the surface of the plated Cu film with the aim of preventing oxidation of plated Cu film due to the atmosphere. The semiconductor substrate to which cap plating has been applied is carried by the second robot 708 from the cap plating unit 750 to the second cleaning unit 707 where it is cleaned with pure water or deionized water. The semiconductor substrate after completion of cleaning is returned into the cassette 701-1 placed on the loading/unloading section 701.

Figure 23:
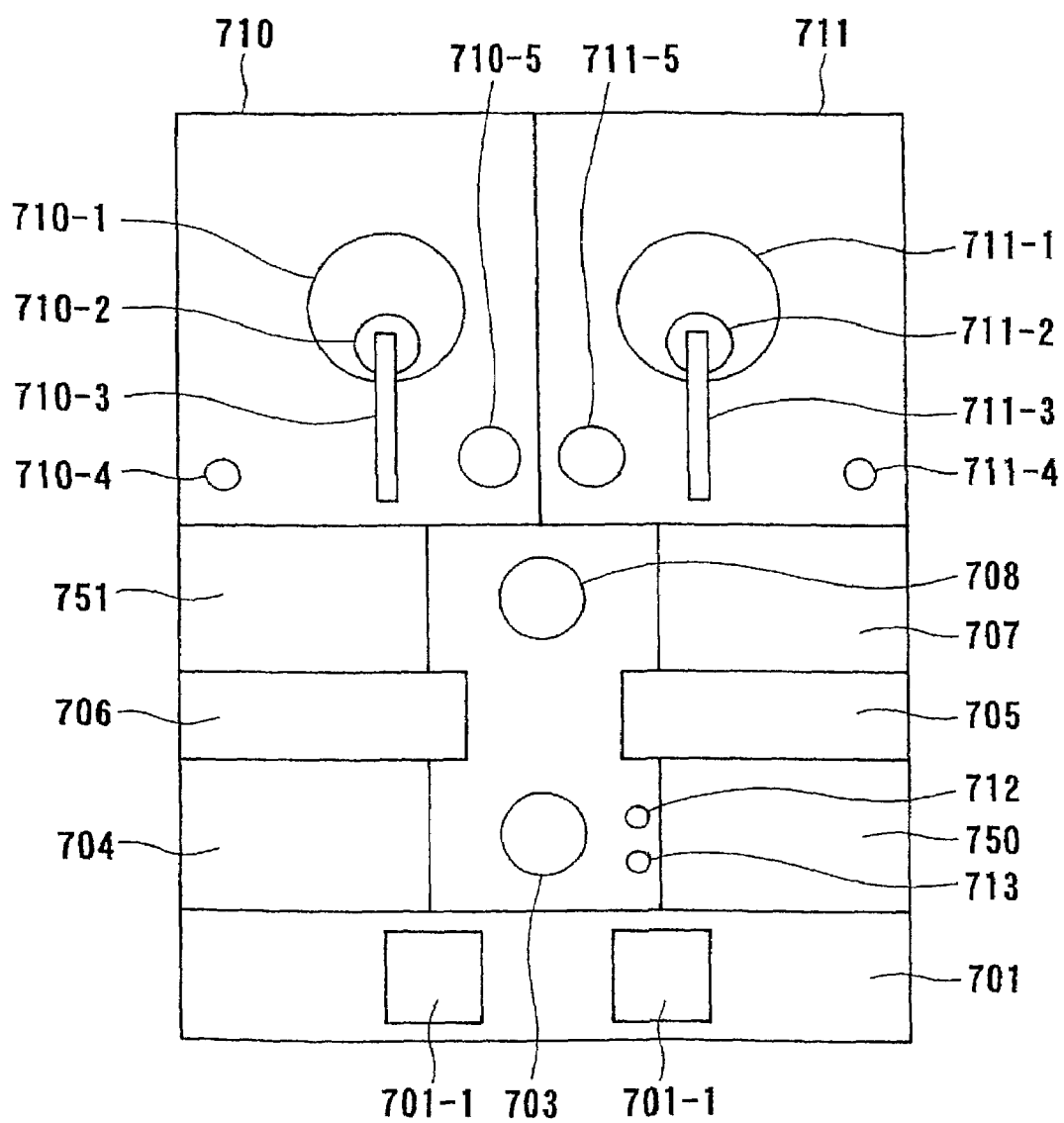
FIG. 23 is a view showing still another plan constitution example of the semiconductor substrate processing apparatus.

FIG. 23 is a view showing the plan constitution of still another example of a semiconductor substrate processing apparatus. The substrate processing apparatus differs from the substrate processing apparatus shown in FIG. 22 in that an annealing unit 751 is provided instead of the third cleaning machine 709 in FIG. 22.

The semiconductor substrate W, which is polished in the polishing unit 710 or 711, and cleaned in the first cleaning machine 709 described above, is transferred to the cap plating unit 750 where cap plating is applied onto the surface of the plated Cu film. The semiconductor substrate to which cap plating has been applied is carried by the second robot 732 from the cap plating unit 750 to the first cleaning unit 707 where it is cleaned.

After completion of cleaning in the first cleaning machine 709, the semiconductor substrate W is transferred to the annealing unit 751 in which the substrate is annealed, whereby the plated Cu film is alloyed so as to increase the electromigration resistance of the plated Cu film. The semiconductor substrate W to which annealing treatment has been applied is carried from the annealing unit 751 to the second cleaning unit 707 where it is cleaned with pure water or deionized water. The semiconductor substrate W after completion of cleaning is returned into the cassette 701-1 placed on the loading/unloading section 701.

FIG. 24 is a view showing a plan layout constitution of another example of the substrate processing apparatus. In FIG. 24, portions denoted by the same reference numerals as those in FIG. 21 show the same or corresponding portions. In the substrate processing apparatus, a pusher indexer 725 is disposed close to a first polishing apparatus 710 and a second polishing apparatus 711. Substrate placing tables 721, 722 are disposed close to a third cleaning machine 704 and a plated Cu film forming unit 702, respectively. A robot 23 is disposed close to a first cleaning machine 709 and the third cleaning machine 704. Further, a robot 724 is disposed close to a second cleaning machine 707 and the plated Cu film forming unit 702, and a dry state film thickness measuring instrument 713 is disposed close to a loading/unloading section 701 and a first robot 703.

In the substrate processing apparatus of the above constitution, the first robot 703 takes out a semiconductor substrate W from a cassette 701-1 placed on the load port of the loading/unloading section 701. After the film thicknesses of a barrier layer and a seed layer are measured with the dry state film thickness measuring instrument 713, the first robot 703 places the semiconductor substrate W on the substrate placing table 721. In the case where the dry state film thickness measuring instrument 713 is provided on the hand of the first robot 703, the film thicknesses are measured thereon, and the substrate is placed on the substrate placing table 721. The second robot 723 transfers the semiconductor substrate W on the substrate placing table 721 to the plated Cu film forming unit 702 in which a plated Cu film is formed. After formation of the plated Cu film, the film thickness of the plated Cu film is measured with a before-plating and after-plating film thickness measuring instrument 712. Then, the second robot 723 transfers the semiconductor substrate W to the pusher indexer 725 and loads it thereon.

[Serial Mode]

In the serial mode, a top ring head 710-2 holds the semiconductor substrate W on the pusher indexer 725 by suction, transfers it to a polishing table 710-1, and presses the semiconductor substrate W against a polishing surface on the polishing table 710-1 to perform polishing. Detection of the end point of polishing is performed by the same method as described above. The semiconductor substrate W after completion of polishing is transferred to the pusher indexer 725 by the top ring head 710-2, and loaded thereon. The second robot 723 takes out the semiconductor substrate W, and carries it into the first cleaning machine 709 for cleaning. Then, the semiconductor substrate W is transferred to the pusher indexer 725, and loaded thereon.

A top ring head 711-2 holds the semiconductor substrate W on the pusher indexer 725 by suction, transfers it to a polishing table 711-1, and presses the semiconductor substrate W against a polishing surface on the polishing table 711-1 to perform polishing. Detection of the end point of polishing is performed by the same method as described above. The semiconductor substrate W after completion of polishing is transferred to the pusher indexer 725 by the top ring head 711-2, and loaded thereon. The third robot 724 picks up the semiconductor substrate W, and its film thickness is measured with a film thickness measuring instrument 726. Then, the semiconductor substrate W is carried into the second cleaning machine 707 for cleaning. Thereafter, the semiconductor substrate W is carried into the third cleaning machine 704, where it is cleaned and then dried by spin-drying. Then, the semiconductor substrate W is picked up by the third robot 724, and placed on the substrate placing table 722.

[Parallel Mode]

In the parallel mode, the top ring head 710-2 or 711-2 holds the semiconductor substrate W on the pusher indexer 725 by suction, transfers it to the polishing table 710-1 or 711-1, and presses the semiconductor substrate W against the polishing surface on the polishing table 710-1 or 711-1 to perform polishing. After measurement of the film thickness, the third robot 724 picks up the semiconductor substrate W, and places it on the substrate placing table 722.

The first robot 703 transfers the semiconductor substrate W on the substrate placing table 722 to the dry state film thickness measuring instrument 713. After the film thickness is measured, the semiconductor substrate W is returned to the cassette 701-1 of the loading/unloading section 701.

Figure 25:
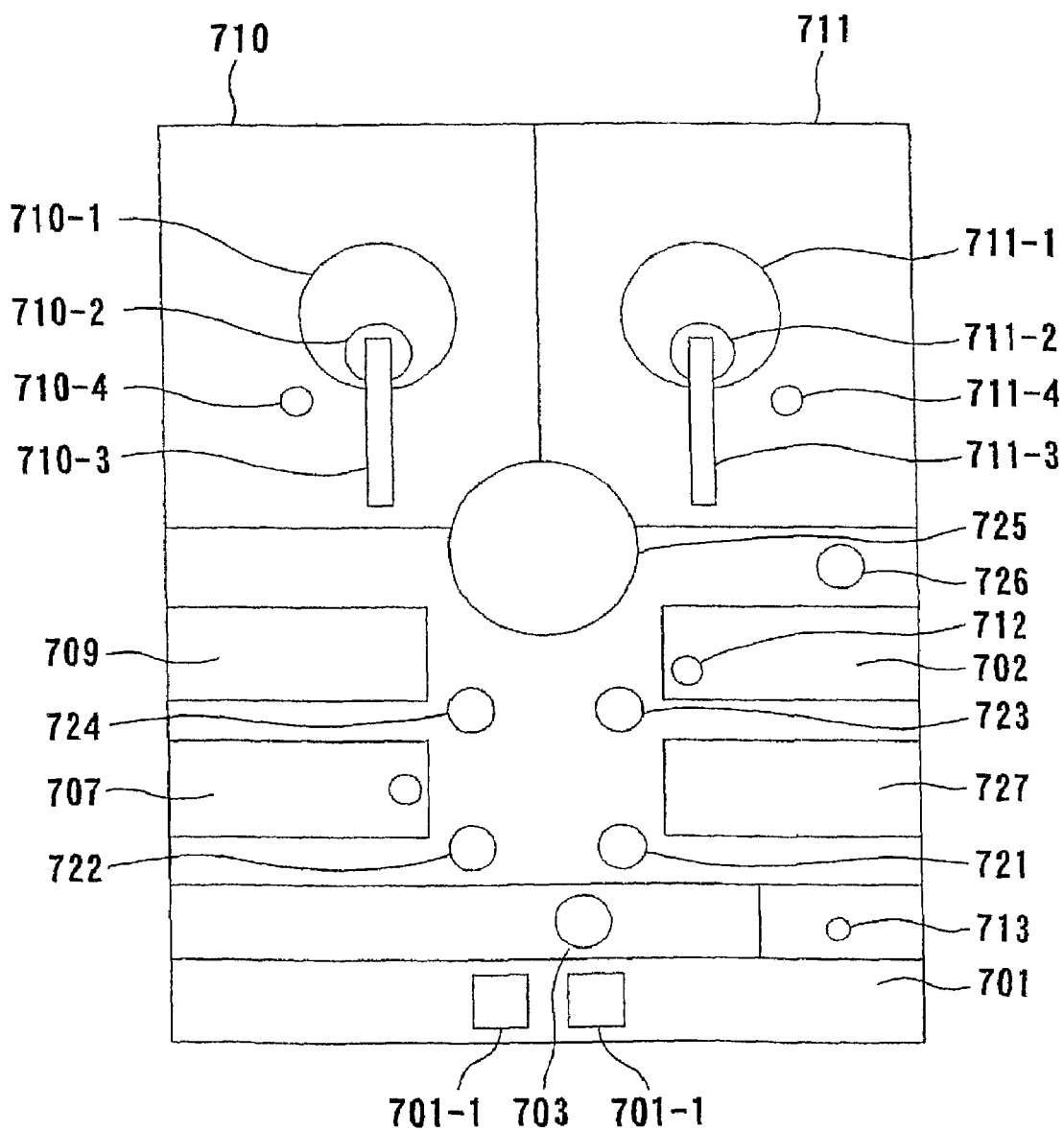
FIG. 25 is a view showing still another plan constitution example of the semiconductor substrate processing apparatus.

FIG. 25 is a view showing another plan layout constitution of the substrate processing apparatus. The substrate processing apparatus is such a substrate processing apparatus which forms a seed layer and a plated Cu film on a semiconductor substrate W having no seed layer formed thereon, and polishes these films to form interconnects.

In the substrate polishing apparatus, a pusher indexer 725 is disposed close to a first polishing apparatus 710 and a second polishing apparatus 711, substrate placing tables 721, 722 are disposed close to a second cleaning machine 707 and a seed layer forming unit 727, respectively, and a robot 723 is disposed close to the seed layer forming unit 727 and a plated Cu film forming unit 702. Further, a robot 724 is disposed close to a first cleaning machine 709 and the second cleaning machine 707, and a dry state film thickness measuring instrument 713 is disposed close to a loading/unloading section 701 and a first robot 702.

The first robot 703 takes out a semiconductor substrate W having a barrier layer thereon from a cassette 701-1 placed on the load port of the loading/unloading section 701, and places it on the substrate placing table 721. Then, the second robot 723 transports the semiconductor substrate W to the seed layer forming unit 727 where a seed layer is formed. The seed layer is formed by electroless-plating. The second robot 723 enables the semiconductor substrate having the seed layer formed thereon to be measured in thickness of the seed layer by the before-plating and after-plating film thickness measuring instrument 712. After measurement of the film thickness, the semiconductor substrate is carried into the plated Cu film forming unit 702 where a plated Cu film is formed.

After formation of the plated Cu film, its film thickness is measured, and the semiconductor substrate is transferred to a pusher indexer 725. A top ring 710-2 or 711-2 holds the semiconductor substrate W on the pusher indexer 725 by suction, and transfers it to a polishing table 710-1 or 711-1 to perform polishing. After polishing, the top ring 710-2 or 711-2 transfers the semiconductor substrate W to a film thickness measuring instrument 710-4 or 711-4 to measure the film thickness. Then, the top ring 710-2 or 711-2 transfers the semiconductor substrate W to the pusher indexer 725, and places it thereon.

Then, the third robot 724 picks up the semiconductor substrate W from the pusher indexer 725, and carries it into the first cleaning machine 709. The third robot 724 picks up the cleaned semiconductor substrate W from the first cleaning machine 709, carries it into the second cleaning machine 707, and places the cleaned and dried semiconductor substrate on the substrate placing table 722. Then, the first robot 703 picks up the semiconductor substrate W, and transfers it to the dry state film thickness measuring instrument 713 in which the film thickness is measured, and the first robot 703 carries it into the cassette 701-1 placed on the unload port of the loading/unloading section 701.

In the substrate processing apparatus shown in FIG. 25, interconnects are formed by forming a barrier layer, a seed layer and a plated Cu film on a semiconductor substrate W having a via hole or a trench of a circuit pattern formed therein, and polishing them.

The cassette 701-1 accommodating the semiconductor substrates W before formation of the barrier layer is placed on the load port of the loading/unloading section 701. The first robot 703 takes out the semiconductor substrate W from the cassette 701-1 placed on the load port of the loading/unloading section 701, and places it on the substrate placing table 721. Then, the second robot 723 transports the semiconductor substrate W to the seed layer forming unit 727 where a barrier layer and a seed-layer are formed. The barrier layer and the seed layer are formed by electroless-plating. The second robot 723 brings the semiconductor substrate W having the barrier layer and the seed layer formed thereon to the before-plating and after-plating film thickness measuring instrument 712 which measures the film thicknesses of the barrier layer and the seed layer. After measurement of the film thicknesses, the semiconductor substrate W is carried into the plated Cu film forming unit 702 where a plated Cu film is formed.

Figure 26:
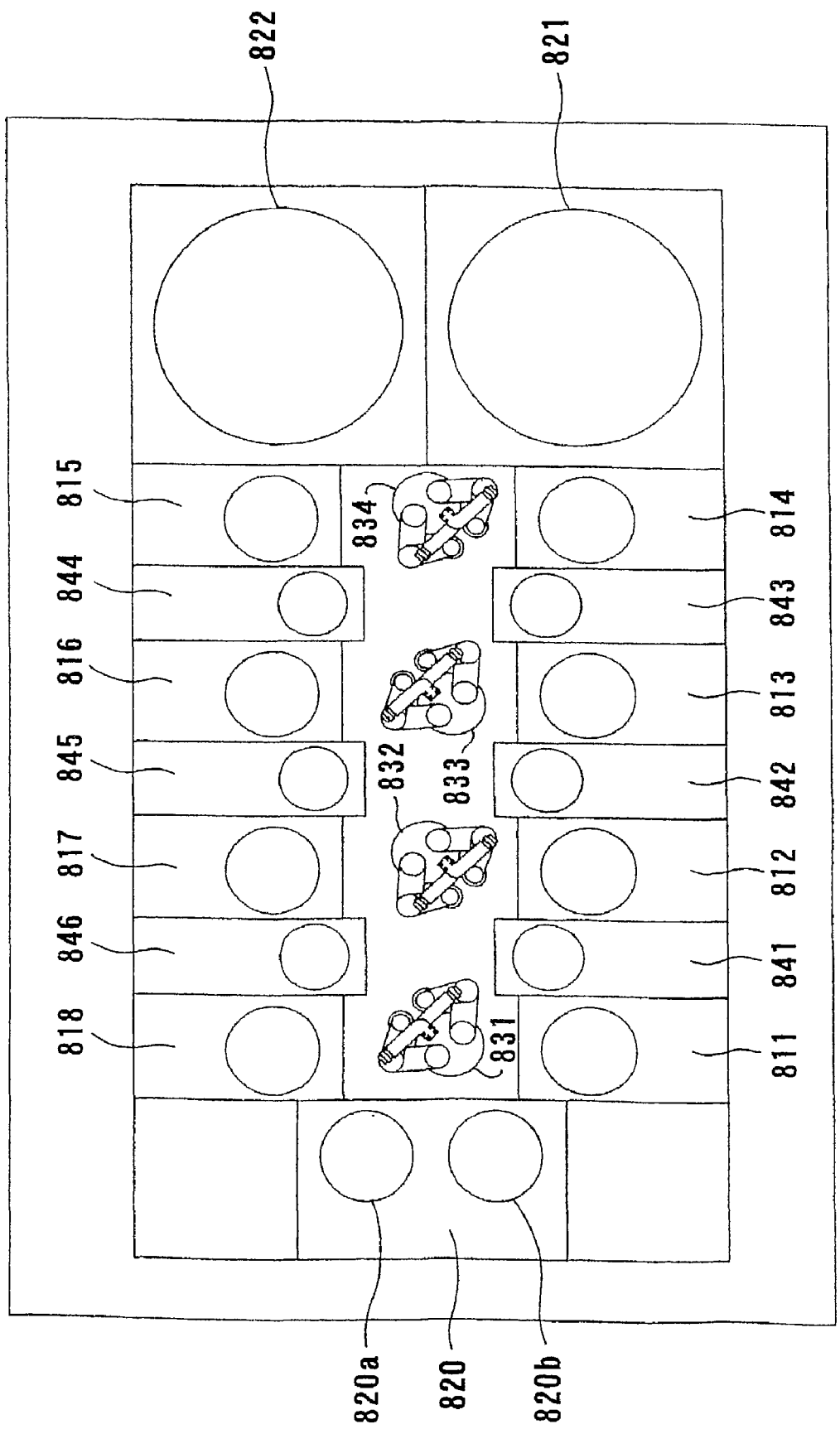
FIG. 26 is a view showing still another plan constitution example of the semiconductor substrate processing apparatus.

FIG. 26 is a view showing plan layout constitution of another example of the substrate processing apparatus. In the substrate processing apparatus, there are provided a barrier layer forming unit 811, a seed layer forming unit 812, a plated film forming unit 813, an annealing unit 814, a first cleaning unit 815, a bevel and backside cleaning unit 816, a cap plating unit 817, a second cleaning unit 818, a first aligner and film thickness measuring instrument 841, a second aligner and film thickness measuring instrument 842, a first substrate reversing machine 843, a second substrate reversing machine 844, a substrate temporary placing table 845, a third film thickness measuring instrument 846, a loading/unloading section 820, a first polishing apparatus 821, a second polishing apparatus 822, a first robot 831, a second robot 832, a third robot 833, and a fourth robot 834. The film thickness measuring instruments 841, 842, and 846 are units, have the same size as the frontage dimension of other units (plating, cleaning, annealing units, and the like), and are thus interchangeable.

In this example, an electroless Ru plating apparatus can be used as the barrier layer forming unit 811, an electroless Cu plating apparatus as the seed layer forming unit 812, and an electroplating apparatus as the plated film forming unit 813.

Figure 27:
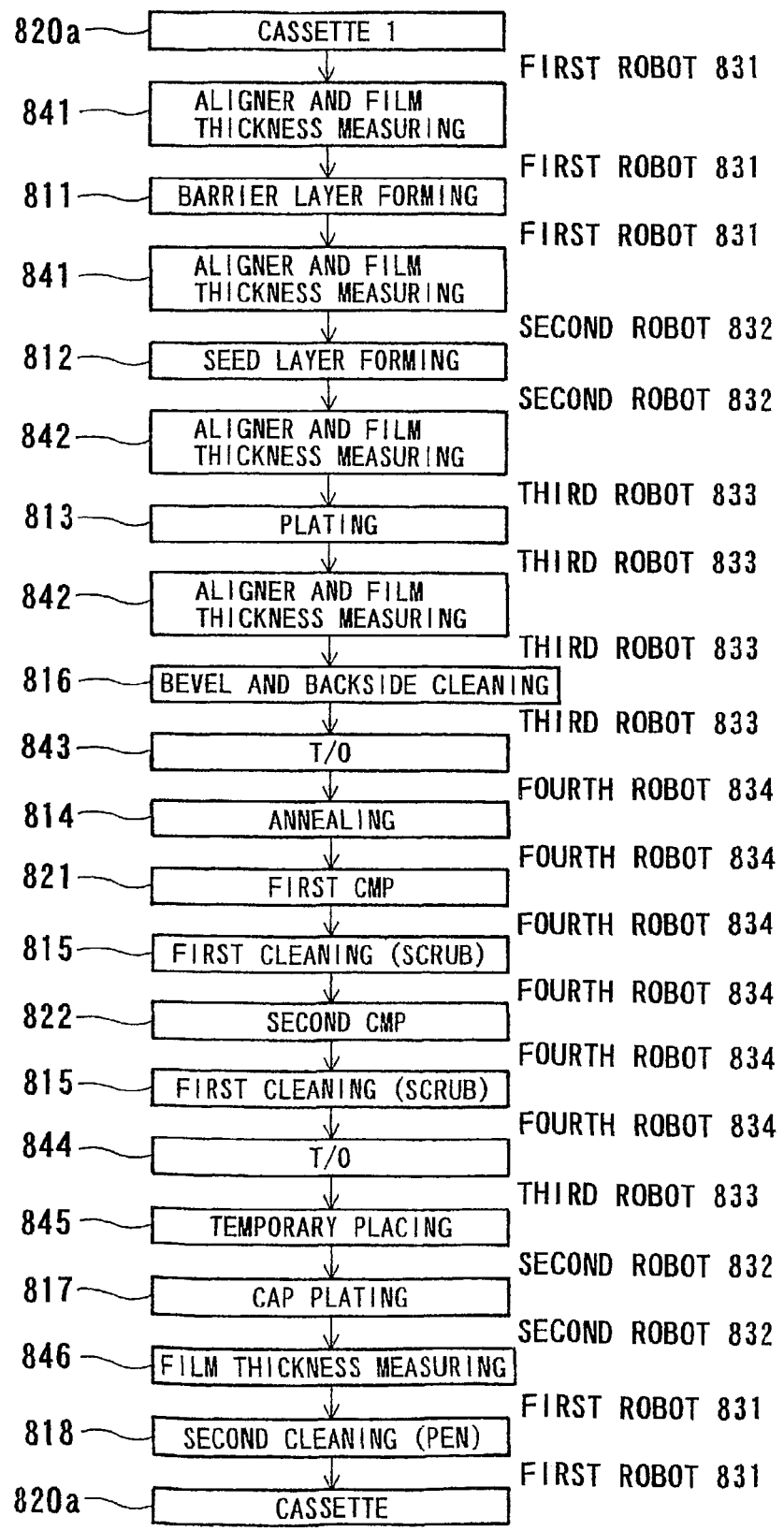
FIG. 27 is a view showing a flow of the respective steps in the semiconductor substrate processing apparatus illustrated in FIG. 26.

FIG. 27 is a flow chart showing the flow of the respective steps in the present substrate processing apparatus. The respective steps in the apparatus will be described according to this flow chart. First, a semiconductor substrate taken out by the first robot 831 from a cassette 820a placed on the load and unload unit 820 is placed in the first aligner and film thickness measuring unit 841, in such a state that its surface, to be plated, faces upward. In order to set a reference point for a position at which film thickness measurement is made, notch alignment for film thickness measurement is performed, and then film thickness data on the semiconductor substrate before formation of a Cu film are obtained.

Then, the semiconductor substrate is transported to the barrier layer forming unit 811 by the first robot 831. The barrier layer forming unit 811 is such an apparatus for forming a barrier layer on the semiconductor substrate by electroless Ru plating, and the barrier layer forming unit 811 forms an Ru film as a film for preventing Cu from diffusing into an interlayer insulator film (e.g. $SiO_2$) of a semiconductor device. The semiconductor substrate discharged after cleaning and drying steps is transported by the first robot 831 to the first aligner and film thickness measuring unit 841, where the film thickness of the semiconductor substrate, i.e., the film thickness of the barrier layer is measured.

The semiconductor substrate after film thickness measurement is carried into the seed layer forming unit 812 by the second robot 832, and a seed layer is formed on the barrier layer by electroless Cu plating. The semiconductor substrate discharged after cleaning and drying steps is transported by the second robot 832 to the second aligner and film thickness measuring instrument 842 for determination of a notch position, before the semiconductor substrate is transported to the plated film forming unit 813, which is an impregnation plating unit, and then notch alignment for Cu plating is performed by the film thickness measuring instrument 842. If necessary, the film thickness of the semiconductor substrate before formation of a Cu film may be measured again in the film thickness measuring instrument 842.

The semiconductor substrate which has completed notch alignment is transported by the third robot 833 to the plated film forming unit 813 where Cu plating is applied to the semiconductor substrate. The semiconductor substrate discharged after cleaning and drying steps is transported by the third robot 833 to the bevel and backside cleaning unit 816 where an unnecessary Cu film (seed layer) at a peripheral portion of the semiconductor substrate is removed. In the bevel and backside cleaning unit 816, the bevel is etched in a preset time, and Cu adhering to the backside of the semiconductor substrate is cleaned with a chemical liquid such as hydrofluoric acid. At this time, before transporting the semiconductor substrate to the bevel and backside cleaning unit 816, film thickness measurement of the semiconductor substrate may be made by the second aligner and film thickness measuring instrument 842 to obtain the thickness value of the Cu film formed by plating, and based on the obtained results, the bevel etching time may be changed arbitrarily to carry out etching. The region etched by bevel etching is a region which corresponds to a peripheral edge portion of the substrate and has no circuit formed therein, or a region which is not utilized finally as a chip although a circuit is formed. A bevel portion is included in this region.

The semiconductor substrate discharged after cleaning and drying steps in the bevel and backside cleaning unit 816 is transported by the third robot 833 to the substrate reversing machine 843. After the semiconductor substrate is turned over by the substrate reversing machine 843 to cause the plated surface to be directed downward, the semiconductor substrate is introduced into the annealing unit 814 by the fourth robot 834 for thereby stabilizing a interconnection portion. Before and/or after annealing treatment, the semiconductor substrate is carried into the second aligner and film thickness measuring unit 842 where the film thickness of a copper film formed on the semiconductor substrate is measured. Then, the semiconductor substrate is carried by the fourth robot 834 into the first polishing apparatus 821 in which the Cu film and the seed layer of the semiconductor substrate are polished.

At this time, desired abrasive grains or the like are used, but fixed abrasive may be used in order to prevent dishing and enhance flatness of the face. After completion of primary polishing, the semiconductor substrate is transported by the fourth robot 834 to the first cleaning unit 815 where it is cleaned. This cleaning is scrub-cleaning in which rolls having substantially the same length as the diameter of the semiconductor substrate are placed on the face and the backside of the semiconductor substrate, and the semiconductor substrate and the rolls are rotated, while pure water or deionized water is flowed, thereby performing cleaning of the semiconductor substrate.

After completion of the primary cleaning, the semiconductor substrate is transported by the fourth robot 834 to the second polishing apparatus 822 where the barrier layer on the semiconductor substrate is polished. At this time, desired abrasive grains or the like are used, but fixed abrasive may be used in order to prevent dishing and enhance flatness of the face. After completion of secondary polishing, the semiconductor substrate is transported by the fourth robot 834 again to the first cleaning unit 815 where scrub-cleaning is performed. After completion of cleaning, the semiconductor substrate is transported by the fourth robot 834 to the second substrate reversing machine 844 where the semiconductor substrate is reversed to cause the plated surface to be directed upward, and then the semiconductor substrate is placed on the substrate temporary placing table 845 by the third robot.

The semiconductor substrate is transported by the second robot 832 from the substrate temporary placing table 845 to the cap plating unit 817 where cap plating is applied onto the Cu surface with the aim of preventing oxidation of Cu due to the atmosphere. The semiconductor substrate to which cap plating has been applied is carried by the second robot 832 from the cover plating unit 817 to the third film thickness measuring instrument 146 where the thickness of the copper film is measured. Thereafter, the semiconductor substrate is carried by the first robot 831 into the second cleaning unit 818 where it is cleaned with pure water or deionized water. The semiconductor substrate after completion of cleaning is returned into the cassette 820a placed on the loading/unloading section 820.

The aligner and film thickness measuring instrument 841 and the aligner and film thickness measuring instrument 842 perform positioning of the notch portion of the substrate and measurement of the film thickness.

The seed layer forming unit 182 may be omitted. In this case, a plated film may be formed on a barrier layer directly in a plated film forming unit 817.

Figure 28:
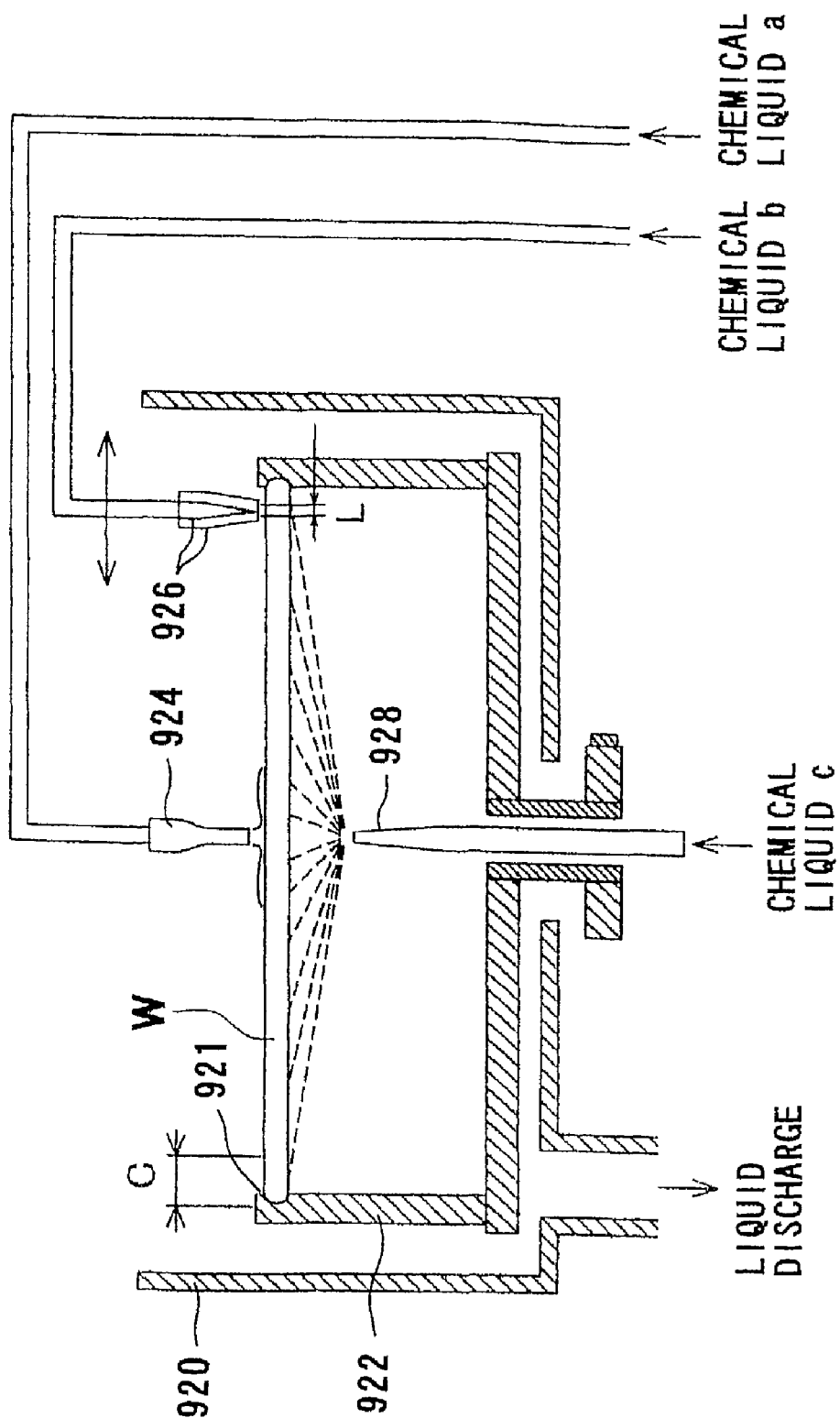
FIG. 28 is a view showing a schematic constitution example of a bevel and backside cleaning unit.

The bevel and backside cleaning unit 816 can perform an edge (bevel) Cu etching and a backside cleaning at the same time, and can suppress growth of a natural oxide film of copper at the circuit formation portion on the surface of the substrate. FIG. 28 shows a schematic view of the bevel and backside cleaning unit 816. As shown in FIG. 28, the bevel and backside cleaning unit 816 has a substrate holding portion 922 positioned inside a bottomed cylindrical waterproof cover 920 and adapted to rotate a substrate W at a high speed, in such a state that the face of the substrate W faces upwardly, while holding the substrate W horizontally by spin chucks 921 at a plurality of locations along a circumferential direction of a peripheral edge portion of the substrate; a center nozzle 924 placed above a nearly central portion of the face of the substrate W held by the substrate holding portion 922; and an edge nozzle 926 placed above the peripheral edge portion of the substrate W. The center nozzle 924 and the edge nozzle 926 are directed downward. A back nozzle 928 is positioned below a nearly central portion of the backside of the substrate W, and directed upward. The edge nozzle 926 is adapted to be movable in a diametrical direction and a height direction of the substrate W.

The width of movement L of the edge nozzle 926 is set such that the edge nozzle 926 can be arbitrarily positioned in a direction toward the center from the outer peripheral end surface of the substrate, and a set value for L is inputted according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not problematic, the copper film within the edge cut width C can be removed.

Next, the method of cleaning with this cleaning apparatus will be described. First, the semiconductor substrate W is horizontally rotated integrally with the substrate holding portion 922, with the substrate being held horizontally by the spin chucks 921 of the substrate holding portion 922. In this state, an acid solution is supplied from the center nozzle 924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper film, or the like formed on the upper surface and end surface in the region of the peripheral edge portion C of the semiconductor substrate W is rapidly oxidized with the oxidizing agent solution, and is simultaneously etched with the acid solution supplied from the center nozzle 924 and spread on the entire face of the substrate, whereby it is dissolved and removed. By mixing the acid solution and the oxidizing agent solution at the peripheral edge portion of the substrate, a steep etching profile can be obtained, in comparison with a mixture of them which is produced in advance being supplied. At this time, the copper etching rate is determined by their concentrations. If a natural oxide film of copper is formed in the circuit-formed portion on the face of the substrate, this natural oxide is immediately removed by the acid solution spreading on the entire face of the substrate according to rotation of the substrate, and does not grow any more. After the supply of the acid solution from the center nozzle 924 is stopped, the supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the semiconductor substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition which will satisfy the requirements of a subsequent process.

In this manner, the acid solution, i.e., etching solution is supplied to the substrate to remove metal ions remaining on the surface of the substrate W. Then, pure water is supplied to replace the etching solution with pure water and remove the etching solution, and then the substrate is dried by spin-drying. In this way, removal of the copper film in the edge cut width C at the peripheral edge portion on the face of the semiconductor substrate, and removal of copper contaminants on the backside are performed simultaneously to thus allow this treatment to be completed, for example, within 80 seconds. The etching cut width of the edge can be set arbitrarily (from 2 to 5 mm), but the time required for etching does not depend on the cut width.

Annealing treatment performed before the CMP process and after plating has a favorable effect on the subsequent CMP treatment and on the electrical characteristics of interconnection. Observation of the surface of broad interconnection (unit of several micrometers) after the CMP treatment without annealing showed many defects such as microvoids, which resulted in an increase in the electrical resistance of the entire interconnection. Execution of annealing ameliorated the increase in the electrical resistance. In the absence of annealing, thin interconnection showed no voids. Thus, the degree of grain growth is presumed to be involved in these phenomena. That is, the following mechanism can be speculated: Grain growth is difficult to occur in thin interconnection. In broad interconnection, on the other hand, grain growth proceeds in accordance with annealing treatment. During the process of grain growth, ultra-fine pores in the plated film, which are too small to be seen by the SEM (scanning electron microscope), gather and move upward, thus forming microvoid-like depressions in the upper part of the interconnection. The annealing conditions in the annealing unit 814 are such that hydrogen (2% or less) is added in a gas atmosphere, the temperature is in the range of 300° C. to 400° C., and the time is in the range of 1 to 5 minutes. Under these conditions, the above effects were obtained.

Figure 31:
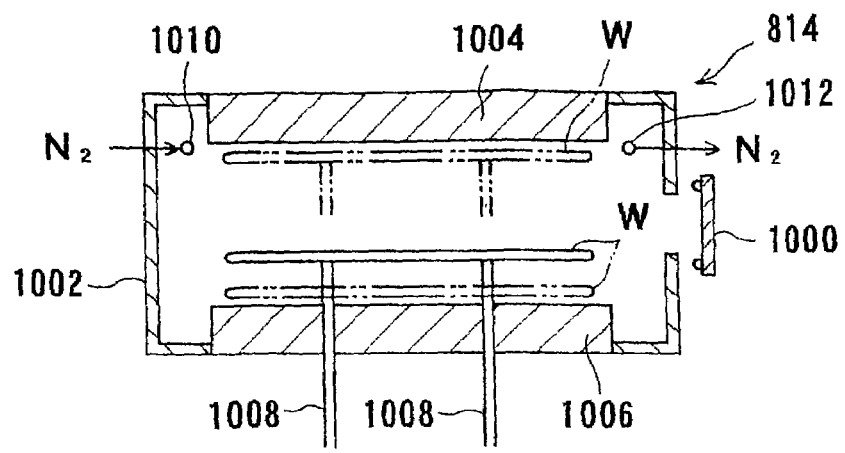
FIG. 31 is a vertical sectional view of an example of an annealing unit.
Figure 32:
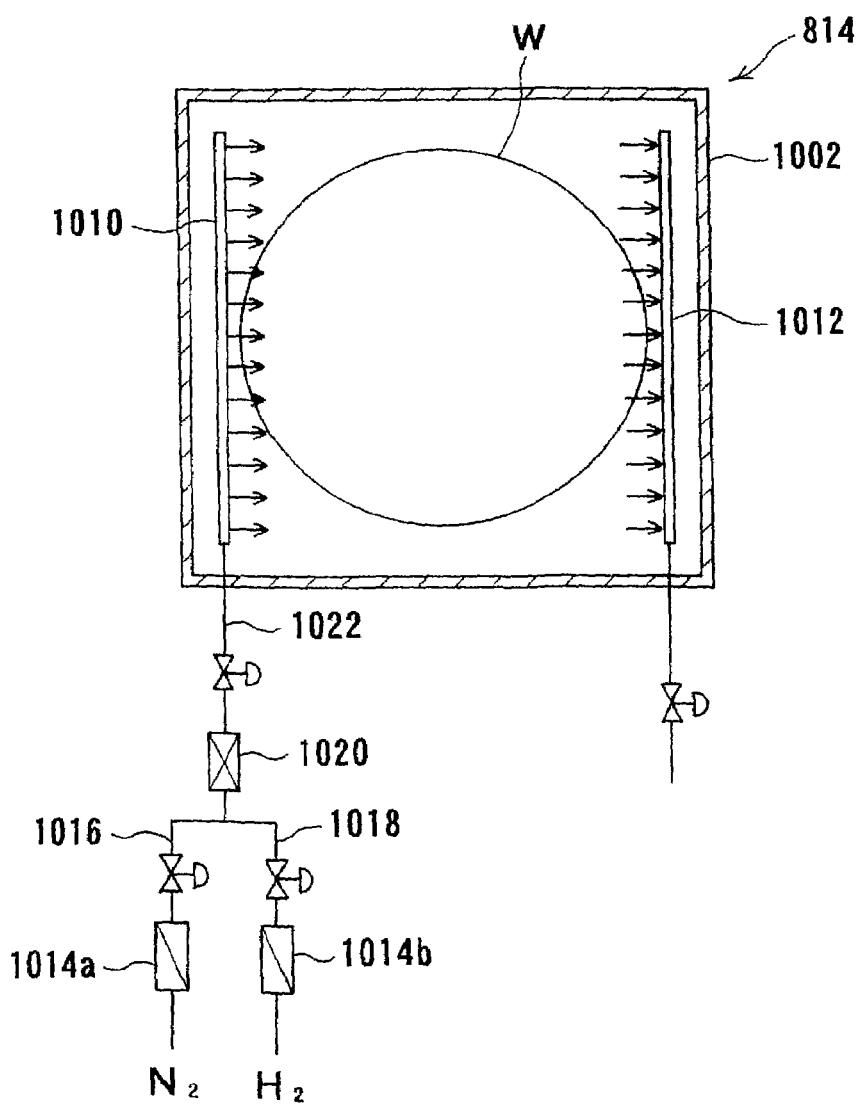
FIG. 32 is a transverse sectional view of the annealing unit.

FIGS. 31 and 32 show the annealing unit 814. The annealing unit 814 comprises a chamber 1002 having a gate 1000 for taking in and taking out the semiconductor substrate W, a hot plate 1004 disposed at an upper position in the chamber 1002 for heating the semiconductor substrate W to e.g. 400° C., and a cool plate 1006 disposed at a lower position in the chamber 1002 for cooling the semiconductor substrate W by, for example, flowing a cooling water inside the plate. The annealing unit 1002 also has a plurality of vertically movable elevating pins 1008 penetrating the cool plate 1006 and extending upward and downward therethrough for placing and holding the semiconductor substrate W on them. The annealing unit further includes a gas introduction pipe 1010 for introducing an antioxidant gas between the semiconductor substrate W and the hot plate 1004 during annealing, and a gas discharge pipe 1012 for discharging the gas which has been introduced from the gas introduction pipe 1010 and flowed between the semiconductor substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014*a*, and a $H_2$ gas introduced through a $H_2$ gas introduction line 1018 containing a filter 1014*b*, are mixed to form a mixed gas which flows through the line 1022 into the gas introduction pipe 1010.

In operation, the semiconductor substrate W, which has been carried in the chamber 1002 through the gate 1000, is held on the elevating pins 1008 and the elevating pins 1008 are raised up to a position at which the distance between the semiconductor substrate W held on the lifting pins 1008 and the hot plate 1004 becomes e.g. 0.1–1.0 mm. In this state, the semiconductor substrate W is then heated to e.g. 400° C. through the hot plate 1004 and, at the same time, the antioxidant gas is introduced from the gas introduction pipe 1010 and the gas is allowed to flow between the semiconductor substrate W and the hot plate 1004 while the gas is discharged from the gas discharge pipe 1012, thereby annealing the semiconductor substrate W while preventing its oxidation. The annealing treatment may be completed in about several tens of seconds to 60 seconds. The heating temperature of the substrate may be selected in the range of 100–600° C.

After the completion of the annealing, the elevating pins 1008 are lowered down to a position at which the distance between the semiconductor substrate W held on the elevating pins 1008 and the cool plate 1006 becomes e.g. 0–0.5 mm. In this state, by introducing a cooling water into the cool plate 1006, the semiconductor substrate W is cooled by the cool plate to a temperature of 100° C. or lower in e.g. 10–60 seconds. The cooled semiconductor substrate is sent to the next step.

A mixed gas of $N_2$ gas with several % of $H_2$ gas is used as the above antioxidant gas. However, $N_2$ gas may be used singly.

The annealing unit may be placed in the electroplating apparatus.

Figure 29:
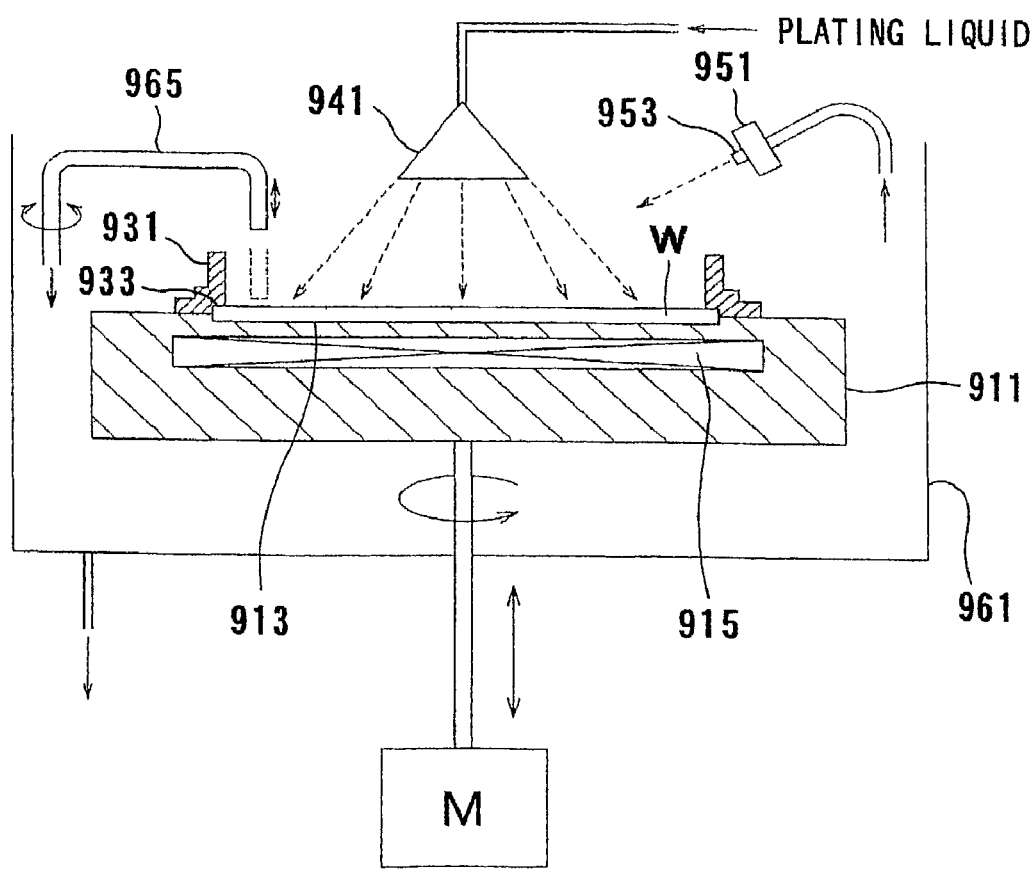
FIG. 29 is a view showing a schematic constitution of an example of an electroless-plating apparatus.

FIG. 29 is a schematic constitution drawing of the electroless-plating apparatus. As shown in FIG. 29, this electroless-plating apparatus comprises holding means 911 for holding a semiconductor substrate W to be plated on its upper surface, a dam member 931 for contacting a peripheral edge portion of a surface to be plated (upper surface) of the semiconductor substrate W held by the holding means 911 to seal the peripheral edge portion, and a shower head 941 for supplying a plating liquid to the surface, to be plated, of the semiconductor substrate W having the peripheral edge portion sealed with the dam member 931. The electroless-plating apparatus further comprises cleaning liquid supply means 951 disposed near an upper outer periphery of the holding means 911 for supplying a cleaning liquid to the surface, to be plated, of the semiconductor substrate W, a recovery vessel 961 for recovering a cleaning liquid or the like (plating waste liquid) discharged, a plating liquid recovery nozzle 965 for sucking in and recovering the plating liquid held on the semiconductor substrate W, and a motor M for rotationally driving the holding means 911. The respective members will be described below.

The holding means 911 has a substrate placing portion 913 on its upper surface for placing and holding the semiconductor substrate W. The substrate placing portion 913 is adapted to place and fix the semiconductor substrate W. Specifically, the substrate placing portion 913 has a vacuum attracting mechanism (not shown) for attracting the semiconductor substrate W to a backside thereof by vacuum suction. A backside heater 915, which is planar and heats the surface, to be plated, of the semiconductor substrate W from underside to keep it warm, is installed on the backside of the substrate placing portion 913. The backside heater 915 is composed of, for example, a rubber heater. This holding means 911 is adapted to be rotated by the motor M and is movable vertically by raising and lowering means (not shown).

The dam member 931 is tubular, has a seal portion 933 provided in a lower portion thereof for sealing the outer peripheral edge of the semiconductor substrate W, and is installed so as not to move vertically from the illustrated position.

The shower head 941 is of a structure having many nozzles provided at the front end for scattering the supplied plating liquid in a shower form and supplying it substantially uniformly to the surface, to be plated, of the semiconductor substrate W. The cleaning liquid supply means 951 has a structure for ejecting a cleaning liquid from a nozzle 953.

The plating liquid recovery nozzle 965 is adapted to be movable upward and downward and swingable, and the front end of the plating liquid recovery nozzle 965 is adapted to be lowered inwardly of the dam member 931 located on the upper surface peripheral edge portion of the semiconductor substrate W and to suck in the plating liquid on the semiconductor substrate W.

Next, the operation of the electroless-plating apparatus will be described. First, the holding means 911 is lowered from the illustrated state to provide a gap of a predetermined dimension between the holding means 911 and the dam member 931, and the semiconductor substrate W is placed on and fixed to the substrate placing portion 913. An 8 inch substrate, for example, is used as the semiconductor substrate W.

Then, the holding means 911 is raised to bring its upper surface into contact with the lower surface of the dam member 931 as illustrated, and the outer periphery of the semiconductor substrate W is sealed with the seal portion 933 of the dam member 931. At this time, the surface of the semiconductor substrate W is in an open state.

Then, the semiconductor substrate W itself is directly heated by the backside heater 915 to render the temperature of the semiconductor substrate W, for example, 70° C. (maintained until termination of plating). Then, the plating liquid heated, for example, to 50° C. is ejected from the shower head 941 to pour the plating liquid over substantially the entire surface of the semiconductor substrate W. Since the surface of the semiconductor substrate W is surrounded by the dame member 931, the poured plating liquid is all held on the surface of the semiconductor substrate W. The amount of the supplied plating liquid may be a small amount which will become a 1 mm thickness (about 30 ml) on the surface of the semiconductor substrate W. The depth of the plating liquid held on the surface to be plated may be 10 mm or less, and may be even 1 mm as in this embodiment. If a small amount of the supplied plating liquid is sufficient, the heating apparatus for heating the plating liquid may be of a small size. In this example, the temperature of the semiconductor substrate W is raised to 70° C., and the temperature of the plating liquid is raised to 50° C. by heating. Thus, the surf ace, to be plated, of the semiconductor substrate W becomes, for example, 60° C., and hence a temperature optimal for a plating reaction in this example can be achieved.

The semiconductor substrate W is instantaneously rotated by the motor M to perform uniform liquid wetting of the surface to be plated, and then plating of the surface to be plated is performed in such a state that the semiconductor substrate W is in a stationary state. Specifically, the semiconductor substrate W is rotated at 100 rpm or less for only 1 second to uniformly wet the surface, to be plated, of the semiconductor substrate W with the plating liquid. Then, the semiconductor substrate W is kept stationary, and electroless-plating is performed for 1 minute. The instantaneous rotating time is 10 seconds or less at the longest.

After completion of the plating treatment, the front end of the plating liquid recovery nozzle 965 is lowered to an area near the inside of the dam member 931 on the peripheral edge portion of the semiconductor substrate W to suck in the plating liquid. At this time, if the semiconductor substrate W is rotated at a rotational speed of, for example, 100 rpm or less, the plating liquid remaining on the semiconductor substrate W can be gathered in the portion of the dam member 931 on the peripheral edge portion of the semiconductor substrate W under centrifugal force, so that recovery of the plating liquid can be performed with a good efficiency and a high recovery rate. The holding means 911 is lowered to separate the semiconductor substrate W from the dam member 931. The semiconductor substrate W is started to be rotated, and the cleaning liquid (ultra-pure water) is jetted at the plated surface of the semiconductor substrate W from the nozzle 953 of the cleaning liquid supply means 951 to cool the plated surface, and simultaneously perform dilution and cleaning, thereby stopping the electroless-plating reaction. At this time, the cleaning liquid jetted from the nozzle 953 may be supplied to the dam member 931 to perform cleaning of the dam member 931 at the same time. The plating waste liquid at this time is recovered into the recovery vessel 961 and discarded.

Then, the semiconductor substrate W is rotated at a high speed by the motor M for spin-drying, and then the semiconductor substrate W is removed from the holding means 911.

Figure 30:
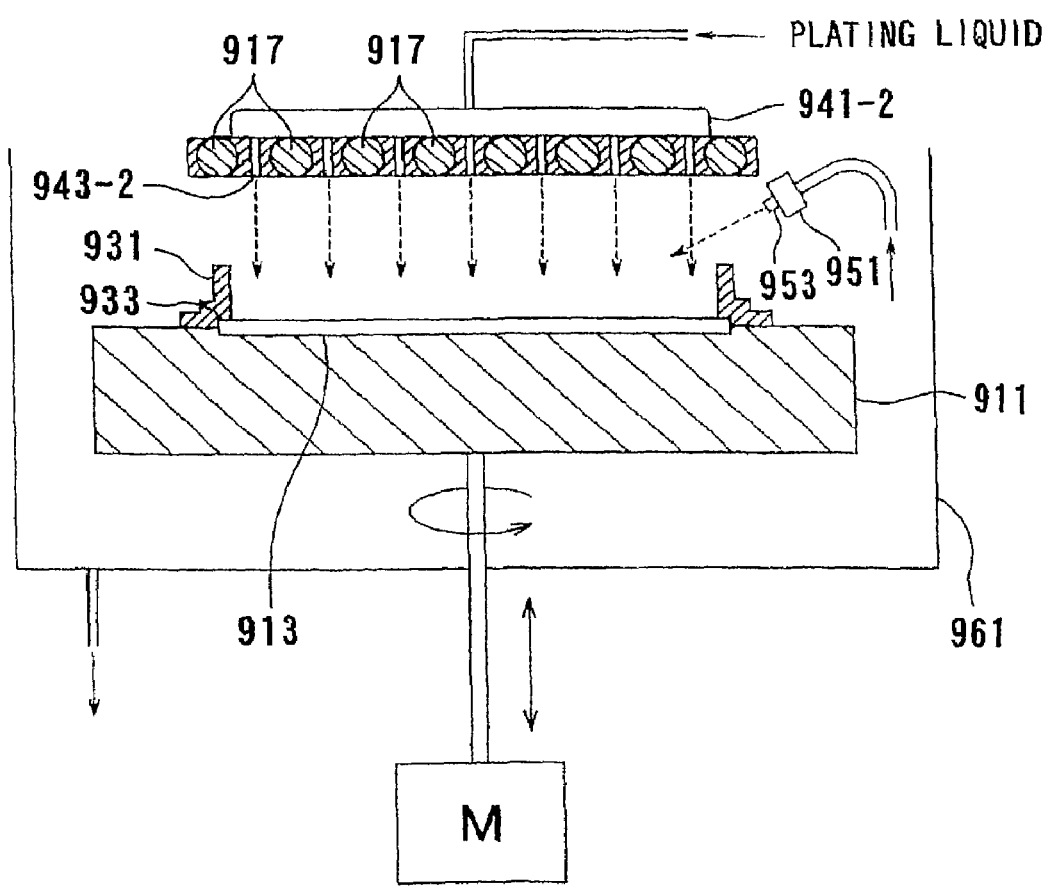
FIG. 30 is a view showing a schematic constitution of another example of an electroless-plating apparatus.

FIG. 30 is a schematic constitution drawing of another electroless-plating. The electroless-plating apparatus of FIG. 30 is different from the electroless-plating apparatus of FIG. 29 in that instead of providing the backside heater 915 in the holding means 911, lamp heaters 917 are disposed above the holding means 911, and the lamp heaters 917 and a shower head 941-2 are integrated. For example, a plurality of ring-shaped lamp heaters 917 having different radii are provided concentrically, and many nozzles 943-2 of the shower head 941-2 are open in a ring form from the gaps between the lamp heaters 917. The lamp heaters 917 may be composed of a single spiral lamp heater, or may be composed of other lamp heaters of various structures and arrangements.

Even with this constitution, the plating liquid can be supplied from each nozzle 943-2 to the surface, to be plated, of the semiconductor substrate W substantially uniformly in a shower form. Further, heating and heat retention of the semiconductor substrate W can be performed by the lamp heaters 917 directly uniformly. The lamp heaters 917 heat not only the semiconductor substrate W and the plating liquid, but also ambient air, thus exhibiting a heat retention effect on the semiconductor substrate W.

Direct heating of the semiconductor substrate W by the lamp heaters 917 requires the lamp heaters 917 with a relatively large electric power consumption. In place of such lamp heaters 917, lamp heaters 917 with a relatively small electric power consumption and the backside heater 915 shown in FIG. 28 may be used in combination to heat the semiconductor substrate W mainly with the backside heater 915 and to perform heat retention of the plating liquid and ambient air mainly by the lamp heaters 917. In the same manner as in the aforementioned embodiment, means for directly or indirectly cooling the semiconductor substrate W may be provided to perform temperature control.

The cap plating described above is preferably performed by electroless-plating process, but may be performed by electroplating process.

Although certain preferred embodiments of the present invention have been shown and described in detail, it should be understood that various changes and modifications may be made therein without departing from the scope of the appended claims.

INDUSTRIAL APPLICABILITY

This invention relates to a plating apparatus and a plating method used to fill fine recesses for interconnections formed on a surface of a semiconductor substrate with copper by plating, thereby forming copper interconnections.

The invention claimed is:

1. A plating method, comprising:
   holding a plating liquid in a plating bath;
   holding a substrate such that the substrate is inclined relative to a horizontal plane;
   holding an anode such that the anode is inclined relative to the horizontal plane so as to be in parallel to the substrate which is inclined relative to the horizontal plane;
   lowering the substrate relative to a surface of the plating liquid held in the plating bath while rotating the substrate to bring the surface of the substrate into contact with the surface of the plating liquid while supplying a plating electric current;
   plating the substrate to fill contact holes and trenches of the substrate with copper;
   stopping the supply of the plating electric current;

lowering a liquid level of the plating liquid so as to expose the substrate above the surface of the plating liquid;
rotating the substrate at a high speed, and then stopping the rotation of the substrate.

2. The plating method according to claim 1, wherein said substrate is held so as to be inclined ranging from 2° to 10° relative to the horizontal plane.

3. The plating method according to claim 1, wherein the substrate is rotated at a rotational speed ranging from 10 to 250 rpm.

4. The plating method according to claim 1, wherein the substrate is rotated at a rotational speed ranging from 40 to 200 rpm to bring the surface of the substrate into contact with the surface of the plating liquid.

5. The plating method according to claim 1, wherein said substrate is vertically moved at a speed ranging from 10 to 250 mm/sec relative to the surface of the plating liquid held in said plating bath.

* * * * *